US00RE42512E

(19) United States
(12) Reissued Patent
Lambert et al.

(10) Patent Number: US RE42,512 E
(45) Date of Reissued Patent: Jul. 5, 2011

(54) METHODS AND APPARATUS FOR EMI SHIELDING

(75) Inventors: Michael R. Lambert, Randolph, NJ (US); Jeff McFadden, Blairstown, NY (US); Philip van Haaster, Corona, CA (US)

(73) Assignee: Laird Technologies, Inc., Chesterfield, MO (US)

(21) Appl. No.: 12/268,250

(22) Filed: Nov. 10, 2008

Related U.S. Patent Documents

Reissue of:
(64) Patent No.: 6,870,092
Issued: Mar. 22, 2005
Appl. No.: 10/310,107
Filed: Dec. 4, 2002

U.S. Applications:
(62) Division of application No. 11/516,803, filed on Sep. 5, 2006, now Pat. No. Re. 41,594.

(60) Provisional application No. 60/378,886, filed on May 8, 2002, provisional application No. 60/336,609, filed on Dec. 4, 2001.

(51) Int. Cl.
*H01R 4/48* (2006.01)
*H05K 9/00* (2006.01)

(52) U.S. Cl. ..... 174/369; 174/383; 454/184; 361/816

(58) Field of Classification Search ..... 174/350, 174/377, 383, 369; 361/816, 818, 752, 753, 361/799, 800; 454/184
See application file for complete search history.

(56) References Cited

U.S. PATENT DOCUMENTS 3,231,663 A 1/1966 Schwartz
3,546,359 A 12/1970 Ciccarelli et al.
3,580,091 A 5/1971 Spencer et al.
3,580,981 A * 5/1971 Lamp et al. ..... 174/383
3,584,134 A 6/1971 Nichols et al.
3,991,242 A 11/1976 Tuttle (Continued)

FOREIGN PATENT DOCUMENTS

EP 1799023 A 6/1996

(Continued)

OTHER PUBLICATIONS

Unpublished U.S. Appl. No. 08/608,341, filed Feb. 28, 1996, Walter Andrew Peregrim.

(Continued)

*Primary Examiner* — Hung V Ngo
(74) *Attorney, Agent, or Firm* — Harness, Dickey & Pierce, P.L.C.

(57) ABSTRACT

Disclosed are methods and apparatus for improving the resiliency and airflow through a honeycomb air vent filter while providing EMI shielding. In one embodiment, the honeycomb can be manufactured from a dielectric (e.g., plastic) substrate to provide improved resistance to deformation as compared to conventional aluminum honeycomb. The dielectric honeycomb substrate is metallized to provide EMI shielding capability. The metallized honeycomb substrate is cut slightly oversize to fit an opening in an electronic enclosure, which results in elastic deformation of resilient perimeter spring fingers that are used to hold the metallized dielectric honeycomb in place and provide electrical conductivity between the metallized dielectric substrate and the enclosure, thereby eliminating the use of a frame. In another embodiment, additional conductive layers can be added to the metallized dielectric honeycomb. In yet another embodiment, the metallized dielectric honeycomb substrate can be utilized in a framed configuration to provide improved durability.

48 Claims, 17 Drawing Sheets

U.S. PATENT DOCUMENTS

| | | | | |
|---|---|---|---|---|
| 4,143,501 | A | 3/1979 | Tuttle | |
| 4,851,608 | A | 7/1989 | Seip | |
| 5,032,689 | A | 7/1991 | Halligan | |
| 5,082,734 | A | 1/1992 | Vaughn | |
| 5,217,556 | A | 6/1993 | Fell | |
| 5,275,861 | A | 1/1994 | Vaughn | |
| 5,489,489 | A | 2/1996 | Swirbel et al. | |
| 5,506,047 | A | 4/1996 | Hedrick et al. | |
| 5,895,885 | A | 4/1999 | Kunkel | |
| 5,910,639 | A | 6/1999 | Kunkel | |
| 6,018,125 | A | 1/2000 | Collins et al. | |
| 6,063,152 | A | 5/2000 | Teter | |
| 6,171,357 | B1 | 1/2001 | Guttmann | |
| 6,211,458 | B1 | 4/2001 | Mitchell et al. | |
| 6,252,161 | B1 | 6/2001 | Hailey et al. | |
| 6,297,446 | B1 * | 10/2001 | Cherniski et al. | 174/383 |
| 6,426,459 | B1 | 7/2002 | Mitchell | |
| 6,610,922 | B1 | 8/2003 | Twiss et al. | |
| 6,646,197 | B1 | 11/2003 | Cugalj et al. | |
| 7,338,547 | B2 | 3/2008 | Johnson et al. | |
| 2002/0046849 | A1 * | 4/2002 | Rapp et al. | 174/35 R |
| 2003/0085050 | A1 | 5/2003 | Zarganis et al. | |
| 2004/0174676 | A1 | 9/2004 | Shi-Tsung | |
| 2006/0150599 | A1 | 7/2006 | Johnson et al. | |
| 2007/0095567 | A1 | 5/2007 | Boyce et al. | |

FOREIGN PATENT DOCUMENTS

| | | | |
|---|---|---|---|
| EP | 0883978 | A1 | 9/1997 |
| EP | 0 843 512 | | 5/1998 |
| EP | 0 843 512 | A2 | 5/1998 |
| EP | 1452080 | | 4/2007 |
| EP | 1799023 | | 11/2008 |
| JP | 08 064988 | | 3/1996 |
| JP | 8 162794 | | 6/1996 |
| JP | 8 264990 | | 10/1996 |
| JP | 10256777 | | 9/1998 |
| JP | 2001503915 | | 3/2001 |
| WO | WO 97/32459 | A | 9/1997 |
| WO | WO 9732459 | | 9/1997 |
| WO | WO 01/13695 | | 2/2001 |
| WO | WO 01/13695 | A1 | 2/2001 |
| WO | WO 2004/032580 | A2 | 4/2004 |

OTHER PUBLICATIONS

Unpublished U.S. Appl. No. 08/608,338, filed Feb. 28, 1996, Walter Andrew Peregrim.

Visual Part Reference Guide—Vent Panels (7 pgs.), no date.

R&F Products, "Absorber Products, Type RF Core" (4 pgs.), May 18, 2001.

http://www.apm-emi.com/airvent.html;APM Product Information, "Air Vent Panels," (5 pgs.), Sep. 21, 2001.

APM Product Information, "EMI Shielding Tape," (3 pgs.), no date.

International Search Report for Published PCT Application WO 03/049521, May 26, 2003.

* cited by examiner

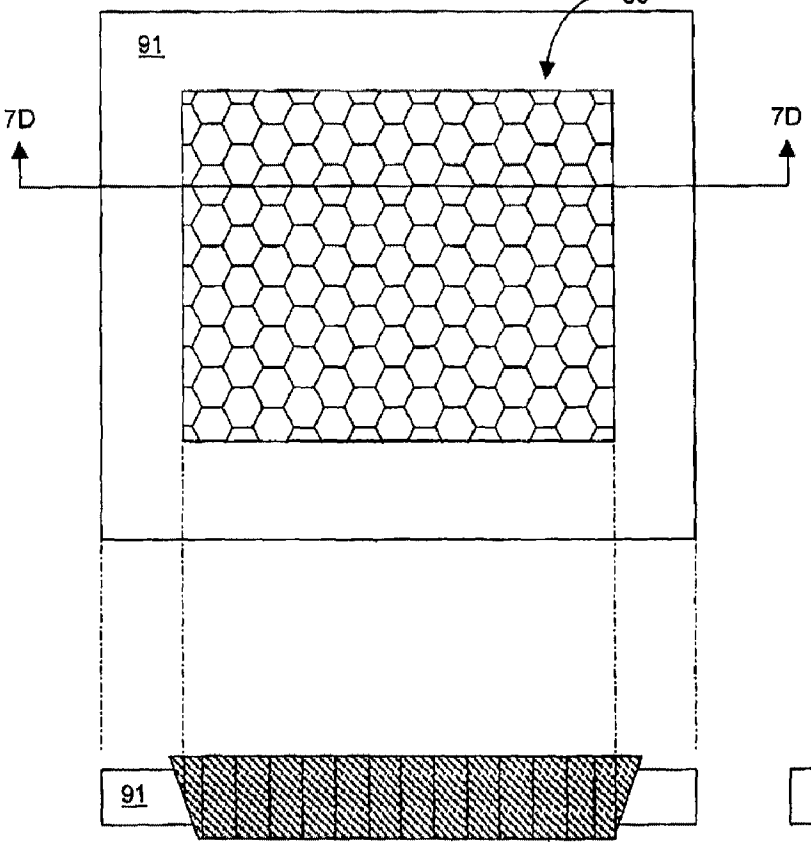
FIG. 7C
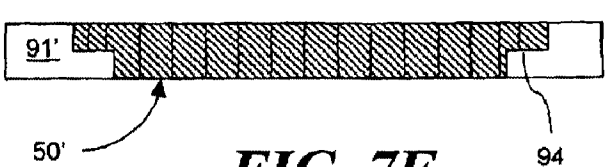
FIG. 7D
FIG. 7E

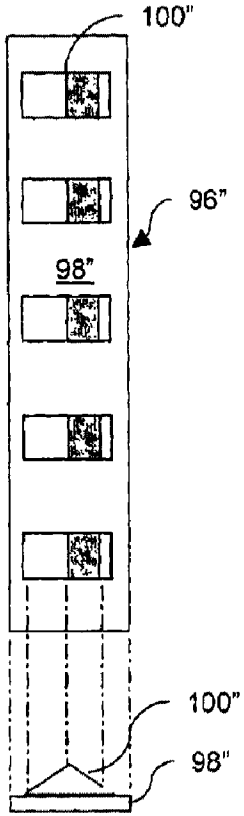
FIG. 8D
FIG. 8E
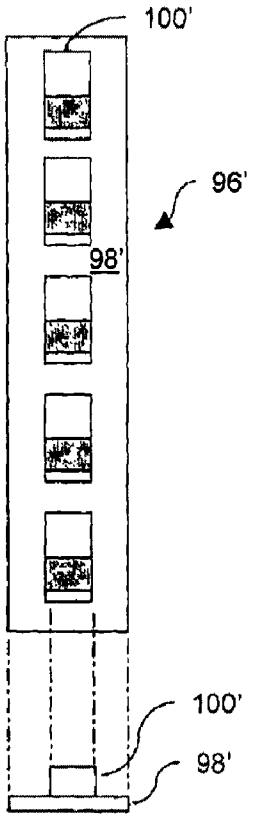
FIG. 8B
FIG. 8C
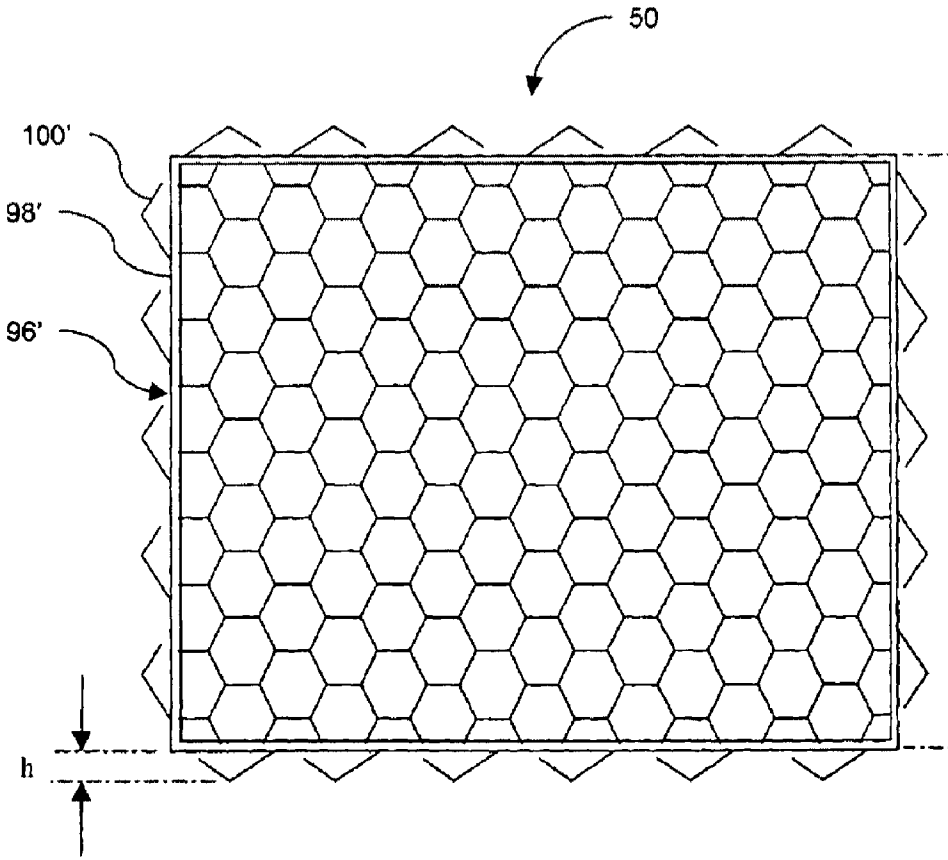
FIG. 8A

METHODS AND APPARATUS FOR EMI SHIELDING

Matter enclosed in heavy brackets [ ] appears in the original patent but forms no part of this reissue specification; matter printed in italics indicates the additions made by reissue.

CROSS-REFERENCE TO RELATED APPLICATIONS

*More than one reissue application has been filed for the reissue of U.S. Pat. No. 6,870,092. The reissue applications are the present divisional reissue application and application Ser. No. 11/516,803, filed Sep. 5, 2006, now Reissue RE41, 594.* This application *is a divisional application from U.S. reissue application Ser. No. 11/516,803, now Reissue RE41, 594, which, in turn is a reissue of U.S. Pat. No. 6,870,092, which issued from U.S. patent application Ser. No. 10/310, 107 filed on Dec, 4, 2002, which, in turn* claims the benefits of U.S. Provisional Application Ser. No. 60/336,609, filed on Dec. 4, 2001, and U.S. Provisional Application Ser. No. 60/378,886, filed on May 8, 2002, the disclosures of which are incorporated herein by reference in their entireties.

FIELD OF THE INVENTION

This invention relates to methods of manufacturing electromagnetic interference ("EMI") shields and the EMI shields produced thereby.

BACKGROUND OF THE INVENTION

As used herein, the term EMI should be considered to refer generally to both EMI and radio frequency interference ("RFI") emissions, and the term electromagnetic should be considered to refer generally to electromagnetic and radio frequency.

During normal operation, electronic equipment generates undesirable electromagnetic energy that can interfere with the operation of proximately located electronic equipment due to EMI transmission by radiation and conduction. The electromagnetic energy can be of a wide range of wavelengths and frequencies. To minimize the problems associated with EMI, sources of undesirable electromagnetic energy may be shielded and electrically grounded. Shielding is designed to prevent both ingress and egress of electromagnetic energy relative to a housing or other enclosure in which the electronic equipment is disposed. Since such enclosures often include vent openings and gaps or seams between adjacent access panels and around doors, effective shielding is difficult to attain, because the gaps in the enclosure permit transference of EMI therethrough. Further, in the case of electrically conductive metal enclosures, these gaps can inhibit the beneficial Faraday Cage Effect by forming discontinuities in the conductivity of the enclosure which compromise the efficiency of the ground conduction path through the enclosure. Moreover, by presenting an electrical conductivity level at the gaps that is significantly different from that of the enclosure generally, the gaps can act as slot antennae, resulting in the enclosure itself becoming a secondary source of EMI.

Specialized EMI gaskets have been developed for use in shielding small gaps in electronic enclosures. These include, but are not limited to, metal spring fingers, wire mesh, fabric-over-foam, and conductive elastomers. To shield EMI effectively, the gasket should be capable of absorbing or reflecting EMI as well as establishing a continuous electrically conductive path across the gap in which the gasket is disposed.

One particularly challenging shielding issue on electronic enclosures is the ventilation opening. In many enclosures, openings that are much larger than gaps along seams and I/O ports are intentionally placed in the enclosures to facilitate the removal of heat. Without EMI shielding, the openings represent huge EMI leakage points. One common approach to shielding these areas is to use ventilation panels, also known as vent panels. Traditional vent panels consist of a metallic honeycomb material mechanically assembled into a stiff metallic frame. This assembly is then fastened to the enclosure with some type of EMI gasketing installed along the enclosure/vent panel interface. The vent panels can be used in the as-manufactured state or they can be plated. Lower cost vent panels, which are usually made of aluminum honeycomb, provide lower levels of shielding effectiveness and are not structurally robust. In applications that require a very robust vent panel, which also provides very high levels of shielding effectiveness, steel or brass honeycomb is often used. These products, however, are much more expensive.

A key attribute of any vent panel is the ease of airflow through the honeycomb, because cooling capability is directly related to volume of airflow per unit of time. Also, in traditional vent panels, electrical contact is made by mechanically crimping the metal frame against the honeycomb material, such that the metal frame causes an indentation of the honeycomb material along the edge of the frame. This insures good electrical contact as long as the frame is not subjected to severe bending or torque.

Enclosures for electronic equipment use airflow to remove heat from the enclosures. Honeycomb filters can be installed in an opening on the enclosure to serve as ventilation panels. In addition, honeycomb filters also provide EMI shielding. Examples of commercially available honeycomb filters are designated "Commercial Honeycomb Ventilation Panels" and "BE 11 ALU-HONEYCOMB FILTERS" air ventilation panels manufactured by Laird Technologies, Inc. (f/k/a Instrument Specialties Co. and Advanced Performance Materials). Another example of commercially available honeycomb filters are designated RF CORE honeycomb cores manufactured by R & F Products, located in San Marcos, Calif. Other similar commercially available ventilation panels are manufactured by Tecknit located in Cranford, N.J., and Chomerics located in Woburn, Mass.

As shown in FIG. 1, commercially available vent panels 10 typically include a honeycomb substrate 12 and a frame 14. The honeycomb substrate 12 is typically made out of very thin strips of corrugated aluminum. In most cases glue, spot welds, or other attachment methods are used to hold the honeycomb substrate 12 together. Piercings are often made between the aluminum layers to improve electrical conductivity. The electrically conductive aluminum honeycomb substrate 12 may optionally be covered with a conductive layer to enhance electrical conductivity across the honeycomb substrate 12. Some examples of conductive layers are an aluminum chromated layer or a tin plated layer. These coatings may also be added to enhance corrosion resistance.

As shown in partial cross-section in FIG. 2, the frame 14 is crimped onto the honeycomb substrate 12. The frame 14 includes solid pincher fingers 16 to grip the honeycomb substrate 12. The frame 14 and honeycomb substrate 12 are in electrical communication with each other so EMI emissions captured by the honeycomb substrate 12 can be transferred from the honeycomb substrate 12 to the frame 14 and ultimately to the electronic enclosure. The design of these pincher fingers 16 results in a line contact between the frame 14 and the honeycomb substrate 12. This feature can make the vent panel 10 susceptible to localized EMI leakage if twisting and jarring of the vent panel 10 degrades that contact area. In addition, the need for the pincher fingers 16 in the metal extrusion limits how narrow the frame 14 can be manufactured, typically not less than 0.25 inch wide.

As shown in FIG. 3, the vent panel 10 is installed in an opening 18 formed in an enclosure 20 for electronic equipment. An EMI gasket 22 is attached to the vent panel 10 about a perimeter thereof to seal EMI leakage paths between the enclosure 20 and the vent panel 10.

The vent panel 10 allows air to flow through the honeycomb substrate 12 to ventilate and cool the electronic equipment inside the enclosure 20. As electronic applications achieve higher clock speeds, and as electronic components are more compactly packed in the enclosure 20, the heat generated within the enclosure 20 increases, necessitating higher airflow. However, airflow through the vent panel 10 is limited by the presence of the frame 14. Depending on the design of the vent panel 10, the presence of the frame 14 can reduce airflow through the opening 18 by about 5% to 15% or more. Traditional frames, with the pincher finger feature, greatly limit the ability to increase vent panel airflow due to the minimum width requirements of the frame material.

Another problem with commercially available vent panels 10 is that they are typically made of aluminum, which is not very resilient and therefore subject to damage. The lack of resiliency results in plastic deformation of the honeycomb filter due to impacts that can be encountered during assembly and field use. To ensure proper airflow after damage, cells of the honeycomb have to be reworked. The rework process is time consuming, requiring the deformed aluminum strips to be bent to open the cells. Even with rework, there is typically degradation of flow through the vent panel 10. In addition, the rework often results in an aesthetically undesirable appearance. There is a need for a honeycomb filter with improved airflow capability and improved durability.

SUMMARY OF INVENTION

One purpose of this invention is to provide improved durability to EMI shielding honeycomb filters. Another purpose of this invention is to provide improved airflow through EMI shielding honeycomb filters.

In one aspect, the invention relates to a vent panel adapted to shield against EMI, the vent panel including a dielectric panel having a thickness defined by a first side and a second side. The dielectric panel defines a number of apertures. The vent panel also includes a first electrically conductive layer applied to the dielectric panel. The resulting conductively coated, or metallized, dielectric panel attenuates a transfer of electromagnetic energy from a first side of the panel to a second side of the panel.

In one embodiment, the dielectric panel is formulated from a polymer, such as acrylonitrile-butadiene-styrene (ABS), polycarbonates, polysulfones, polyamides, and polypropylenes. In another embodiment, the dielectric panel includes a plurality of tubes or other shapes fastened together. In another embodiment, the dielectric panel includes a plurality of tubes or other shapes co-extruded together. In yet another embodiment, the dielectric panel is manufactured by injection molding.

In one embodiment, the electrically conductive layer includes a first layer selected from the group consisting of copper, nickel, tin, aluminum, silver, graphite, bronze, gold, lead, palladium, cadmium, zinc and combinations thereof. In another embodiment, the electrically conductive layer includes a second electrically conductive layer, which may consist of the same or a different conductive material in electrical communication with the first electrically conductive layer.

In one embodiment, the plurality of apertures are configured as a two-dimensional array of like apertures, each aperture having a cross-sectional shape, such as a circle, a hexagon, a rectangle, etc. The vent panel includes a conductive edge extending substantially about the perimeter, being adapted for placing the vent panel into electrical communication with the chassis in which the vent panel is mounted. In some embodiments, the conductive edge also mechanically secures the vent panel within an aperture in the chassis. For example, the conductive edge can include resilient spring fingers, dimples, and combinations of these provided along a band extending about the perimeter. The resilient spring fingers and dimples compress against an opposing mating surface of the chassis upon installation, thereby providing electrical contact.

In another aspect, the invention relates to a method for manufacturing a vent panel adapted to shield against EMI. The suitably adapted vent panel is manufactured by providing a dielectric panel having a thickness defined by a first side and a second side, and defining an array of apertures. A first electrically conductive layer is applied to the dielectric panel.

In one embodiment, a first conductive layer is applied using one or more of electroless plating, radio-frequency sputtering, direct-current sputtering, or physical deposition. In some embodiments, a second electrically conductive layer is applied using the same or a different plating method.

In one embodiment, the dielectric panel is provided by fastening a number of dielectric tubes together. In another embodiment, the dielectric panel is provided by co-extruding together a number of tubes. In another embodiment, the dielectric panel is provided by injection molding. And, in yet another embodiment, the dielectric panel is provided by machining.

In one embodiment, the conductively coated dielectric panel is tapered to provide a snug mechanical fit also having good electrical contact. In another embodiment, the dielectric panel is selectively cut along its edges to provide a "spring-finger" action that together with whole cells along its perimeter provides a snug fit by compressing the cells and/or portions of cells along its perimeter. In another embodiment, a conductive strap having compressible fingers and/or dimples is applied to the perimeter of the metallized dielectric vent panel such that the compressible fingers [an/or] *and/or* dimples make contact with an opposing surface, for example a chassis, thereby providing a snug mechanical fit and good electrical contact.

BRIEF DESCRIPTION OF THE DRAWINGS

The above and further advantages of this invention may be better understood by referring to the following description, taken in conjunction with the accompanying drawings, in which:

FIG. 7C is a schematic drawing of a metallized dielectric honeycomb filter, angled in the thickness direction, installed vertically in an opening in an enclosure for electronic equipment;

FIG. 7D is a cross-section of the metallized dielectric honeycomb filter, angled in the thickness direction, installed vertically in an opening in an enclosure for electronic equipment taken along section 7D-7D of FIG. 7C;

FIG. 7E is a cross-section of an alternative embodiment of the metallized dielectric honeycomb filter having a rabbet edge along its perimeter, installed vertically in an opening in an enclosure for electronic equipment taken along section 7D-7D of FIG. 7C;

FIG. 8A is a schematic drawing illustrating a top view of a band frame surrounding a metallized dielectric honeycomb vent panel in which the band frame has horizontal spring fingers;

FIG. 8B is a schematic drawing illustrating a front view of the band frame in which the band frame has horizontal spring fingers;

FIG. 8C is a schematic drawing illustrating a side view of the banded frame in which the band frame has horizontal spring fingers;

FIG. 8D is a schematic drawing illustrating a front view of an alternative band frame in which the band frame has vertical spring fingers;

FIG. 8E is a schematic drawing illustrating a side view of the alternative frame in which the band frame has vertical spring fingers;

DETAILED DESCRIPTION OF THE INVENTION

According to the present invention, honeycomb filters used for airflow and EMI shielding can have improved airflow and durability through the use of a metallized dielectric honeycomb substrate and a frameless filter design. Metallized dielectric honeycomb substrate utilized in a reduced frame design can also be used to provide even greater durability along with increased airflow.

Figure 1:
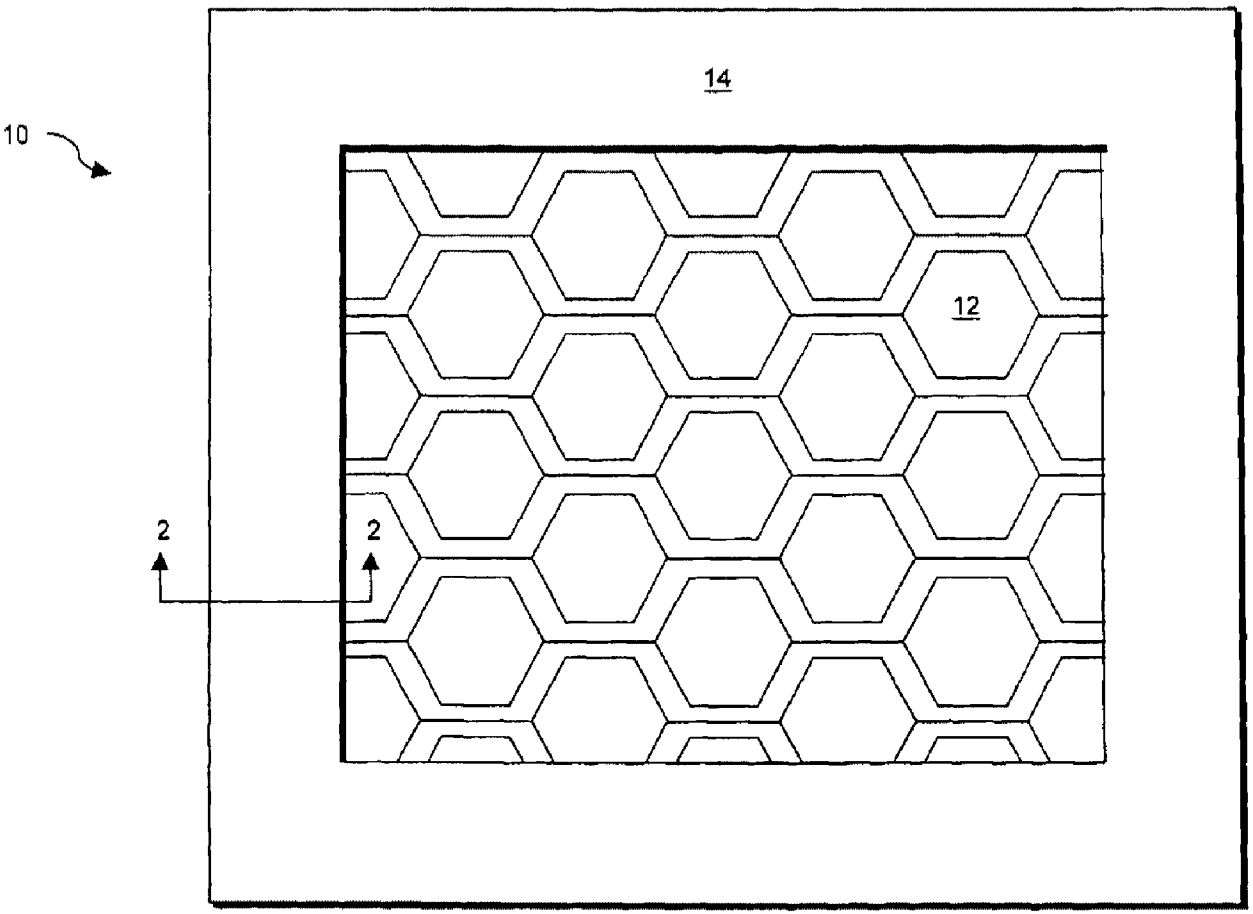
FIG. 1 is a schematic drawing of a conventional aluminum air filter.
Figure 2:
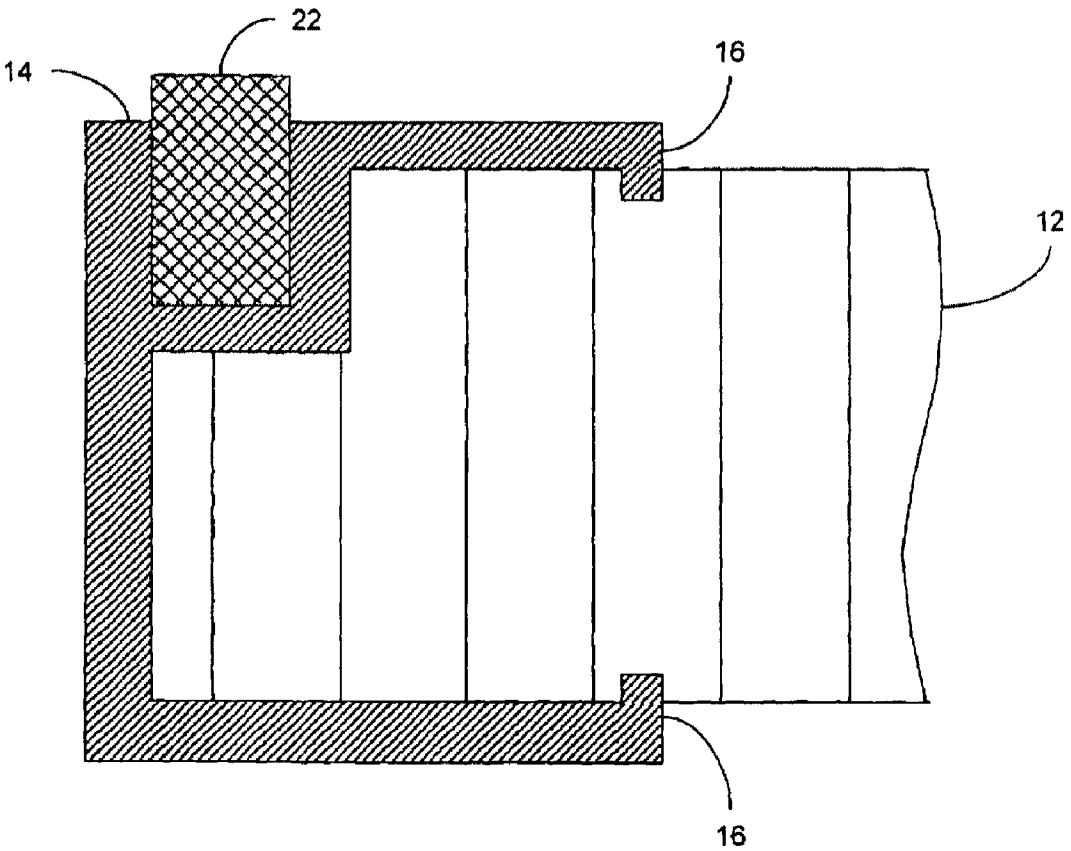
FIG. 2 is a schematic drawing of a partial cross-section of an aluminum honeycomb substrate and a frame for the conventional aluminum air filter.
Figure 3:
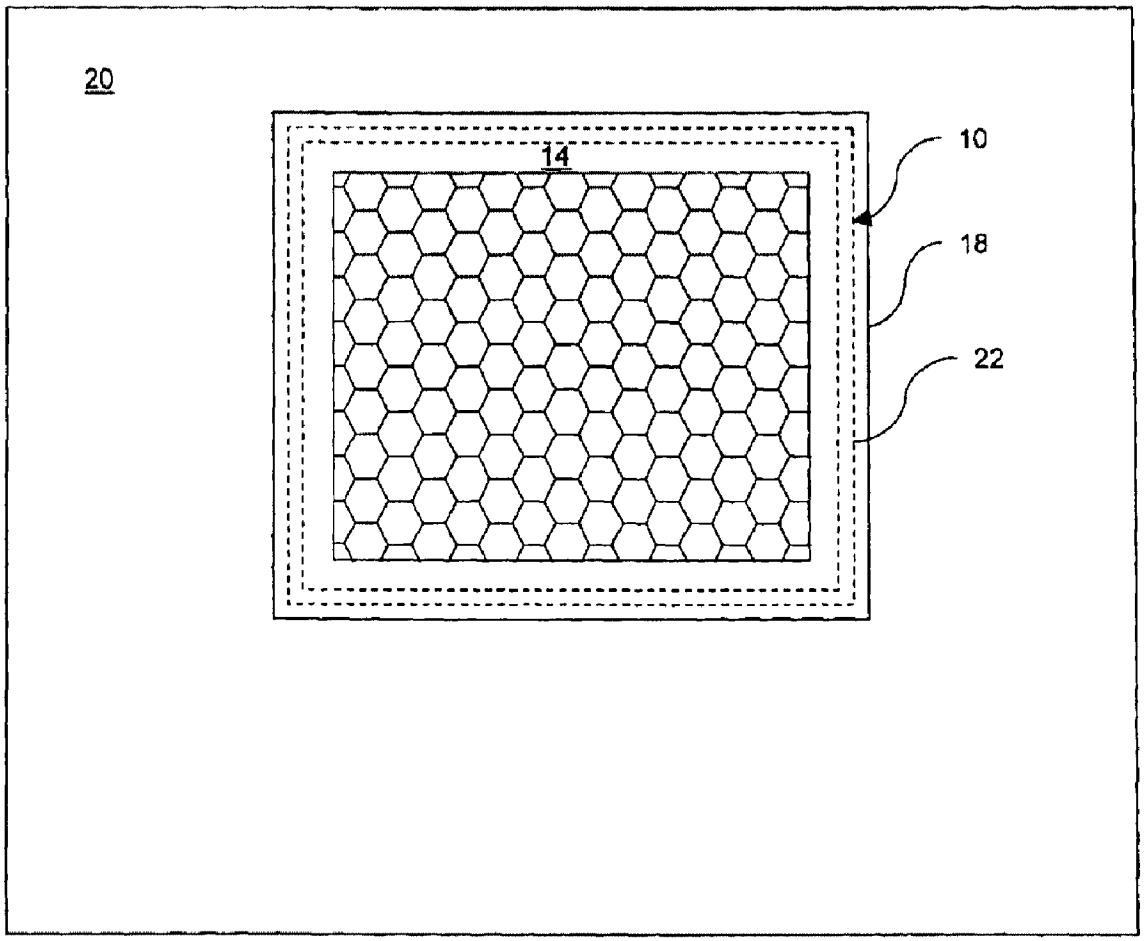
FIG. 3 is a schematic drawing of the conventional aluminum air filter installed in an opening in an enclosure for electronic equipment.
Figure 4:
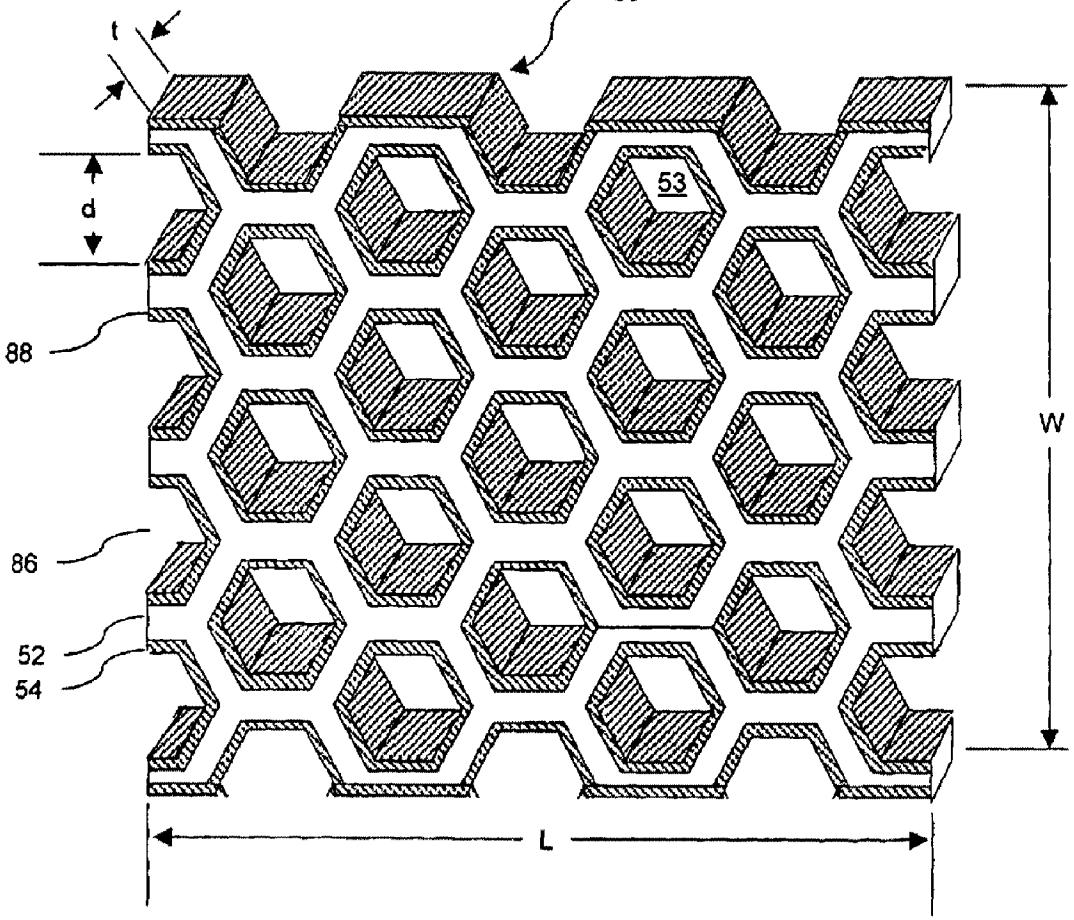
FIG. 4 is a schematic drawing depicting a perspective view of a cross-section of a metallized dielectric honeycomb filter.

FIG. 4 shows in perspective view, a cross-section of one embodiment of a metallized dielectric honeycomb filter 50. The metallized dielectric honeycomb filter 50 includes a dielectric honeycomb substrate 52 and a conductive layer 54. As used herein, the term honeycomb refers to a two-dimensional array of apertures of arbitrary cross-section. The aperture cross-section can be any shape, such as hexagonal, circular, elliptical, square, rectangular, triangular, rhomboidal, or other, and combinations thereof. The dielectric honeycomb substrate 52 is selected to provide significantly improved resiliency as compared to conventional aluminum honeycomb filters. Due to the improved resiliency, the dielectric honeycomb substrate 52 is much less likely to be deformed permanently under load or impact conditions that can be encountered during assembly and normal operation. By minimizing the possibility of deforming through the use of the dielectric honeycomb substrate 52, much of the rework required to fix damaged aluminum honeycomb filters in order to maintain proper airflow through the filter is thereby eliminated.

The dielectric honeycomb substrate 52 can be made out of any dielectric material, such as plastic. For example, some materials that can be used for the dielectric honeycomb substrate 52 are acrylonitrile-butadiene-styrene (ABS), polycarbonates, polysulfones, polyamides, polypropylenes, polyethylene, and polyvinyl chloride (PVC). Additionally, other dielectric materials may be used such as fiberglass and paper products, such as aramid (e.g., Kevlar®) sheets, and aramid fiber paper. Dielectric honeycomb substrates are commercially available. For example, Kevlar® honeycomb cores (e.g., Ultracor part no. PN UKF-85-1/4-1.5), carbon honeycomb cores (e.g., Ultracor part no. UCF-145-3/8-0.8) are commercially available from Ultracor Inc., located in Livermore, Calif., Aramid fiber honeycomb cores (e.g., Hexcel part no. PN HRH-10), fiberglass honeycomb cores (e.g., Hexcel part no. HRP) are commercially available from Hexcel Corp., located in Danbury, Conn., and polypropylene honeycomb cores (e.g., Plascore part no. PP30-5) are commercially available from Plascore, Inc., located in Zeeland, Mich.

The dielectric honeycomb substrate 52 can have cells 53 sized to meet a particular application. The substrate 52 can be described as having an overall length, L, and an overall width, W. The dimensions L and W are typically determined by a particular application, generally matching the dimensions of an aperture to be shielded. Each one of the cells 53 can be described as having a cross-section diameter, d, and a thickness, t. The dimensions (d, t) for a cell 53 are generally selected to provide a predetermined level of EMI performance, often referred to as shielding effectiveness. Each cell, in essence, represents a waveguide that will generally pass EMI having wavelengths, ($\lambda_{EMI}$), less than a cutoff wavelength, $\lambda_c$, (i.e., high frequencies) while rejecting EMI having wavelengths greater than $\lambda_c$ (i.e., low frequencies).

A general relationship, presented in equation 1, can be defined for approximating the shielding effectiveness in terms of the above geometric parameters, for an individual cell, measured in decibels (dB). A geometry-dependent constant K is approximately 32 for circular cells, and 27 for rectangular cells.

$$\text{Shielding_Effectiveness}_{dB} \approx K\frac{t}{d}\sqrt{(\lambda_{EMI}/\lambda_c)^2 - 1} \qquad \text{(Equation 1)}$$

Typically, the cell diameter, d, can range from about 0.06 inches to about 1.0 inch, while the cell thickness, t, can range from about 0.125 inch to 1.5 inches with common depths of 0.25 inch to 1 inch.

The density of the dielectric honeycomb substrate 52 can range from about 2 lb/ft$^3$ to about 20 lb/ft$^3$. By selecting a lower density dielectric honeycomb substrate 52, the flexibility of the dielectric honeycomb substrate can be increased, which generally decreases spring force in the honeycomb substrate 52. Typical wall thickness range [of] *from* 0.002 inch to 0.05 inch, but are not limited to this range. For applications where a more rugged dielectric honeycomb substrate 52 is required, a higher density dielectric honeycomb substrate 52 or a different honeycomb geometry can be selected.

Figure 5:
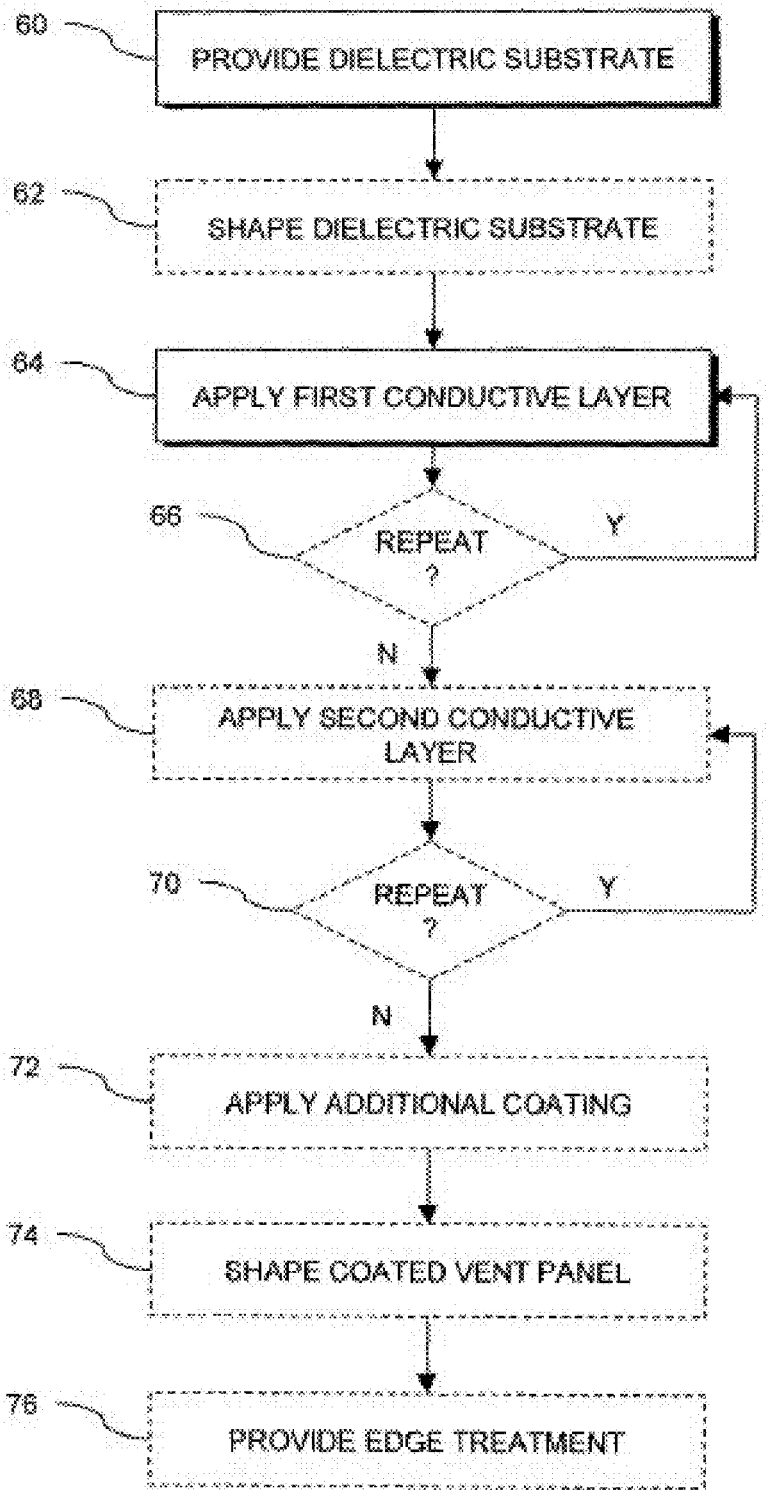
FIG. 5 is a flow diagram illustrating an embodiment of a process for preparing certain embodiments of the invention.

To manufacture a vent panel according to the invention, in one embodiment referring now to FIG. 5, a dielectric vent panel, such as the honeycomb substrate 52 described above, is provided (step 60). The honeycomb substrate 52 can be prepared by extrusion or by molding (e.g., injection molding) as an integral element. Such molding techniques are well adapted for polymer substrates. Alternatively, the honeycomb substrate 52 can also be manufactured by bonding or otherwise attaching together a plurality of corrugated strips. Such bonding techniques are well adapted to substrates formed from a fibrous material, such as paper, as well as polymer substrates. Alternatively, a number of tubes, each tube forming one of the cells 53, can be fastened together in a planar array, such that a longitudinal axis of each of the tubes is generally parallel with the axes of its neighboring tubes. The fastening could be achieved using a chemical bond, such as a glue, a thermal weld, or a mechanical bond, such as a crimp. The honeycomb substrate 52 can also be manufactured by other methods, such as machining a sheet of the substrate material, for example by boring each of the cells 53 using a drill, or cutting each using a die.

Next, the dielectric honeycomb substrate 52 can be shaped into any desired configuration (step 62). For example, a planar dielectric substrate 52 can be configured in any desired planar shape, such as a square, a rectangle, a circle, etc., having predetermined dimensions to conform to an intended aperture. Such overall shaping can be performed during the manufacturing stage of the substrate 52, for example by selectively altering the shape of a mold, or extruder. The shaping can also be performed post-manufacturing. For example, the substrate 52 can be cut using a knife, a saw, shears, a laser, or a die. Additionally, certain dielectric substrates, such as polymers, lend themselves to a variety of machining techniques. For example, a dielectric honeycomb substrate 52 can be machined to shape one or more of its edges along its perimeter to include a bevel, or a rabbet. Still further, the dielectric substrate 52 can be shaped to include a convex or concave surface or indentation over a portion of either or both of its planar surfaces. Such a planar surface deformation may be desired, to accommodate a mechanical fit.

In order to provide EMI shielding, a conductive layer 54 is applied to the dielectric honeycomb substrate 52, resulting in the metallized dielectric honeycomb filter 50. In one method, a first conductive layer is applied to the dielectric honeycomb substrate 52 (step 64). The first conductive layer can be applied using a variety of techniques known to those skilled in the art, such as electroless plating or physical vapor deposition. See, for example, U.S. Pat. No. 5,275,861 issued to Vaughn and U.S. Pat. No. 5,489,489 issued to Swirbel et al., the disclosures of which are herein incorporated by reference in their entirety. For example, a conductor, such as copper, can be applied using an electroless bath as taught by Vaughn.

The electroless bath method is particularly well suited for a class of polymers known as plateable plastics. This class of plastics includes acrylonitrile-butadiene-styrene (ABS) and polycarbonates, along with other polymer compounds, such as polysulfones, polyamides, polypropylenes, polyethylene, and polyvinyl chloride (PVC). Generally, the dielectric honeycomb substrate 52 should be pretreated to remove any impurities (e.g., dirt, and oil). Depending on the type of material, the substrate 52 may be treated still further to enhance its adhesion properties with the initial conductive layer. For example, the surface can be abraded by mechanical means (e.g., sanding or sandblasting) or by a chemical means (e.g., by using a solvent for softening or an acid for etching). A chemical pretreatment can also be added to alter the chemistry of the surface, further enhancing its ability to chemically bond to the first layer.

Other methods of applying the first conductive layer include applying a conductive paint, such as a lacquer or shellac impregnated with particulate conductors, such as copper, silver, or bronze. Still other methods of applying the first conductive layer include physical deposition, such as evaporation, non-thermal vaporization process (e.g., sputtering), and chemical vapor deposition. Sputtering techniques include radio-frequency (RF) diode, direct-current (DC) diode, triode, and magnetron sputtering. Physical vapor deposition includes such techniques as vacuum deposition, reactive evaporation, and gas evaporation.

Depending on the desired thickness and/or coverage, the step of applying the first conductive layer can be optionally repeated (step 66), such that one or more additional conductive layers, being made of substantially the same conductor, are applied to the previously-treated substrate 52, thereby increasing the thickness of the layer. In repeating the application of the conducting layer, generally the same method of plating can be used; however, a different method can also be used.

Generally, any conductive material can be used for the conductive layer 54. Some examples of metals that can be used for the conductive layer 54 are copper, nickel, tin, aluminum, silver, graphite, bronze, gold, lead, palladium, cadmium, zinc and combinations or alloys thereof, such as lead-tin and gold-palladium. The conductive layer 54 can also be applied directly as a conductive compound. For example, the substrate 52 can be treated with a single electroless bath having both copper and nickel. The resulting conductive layer 54 is a compound of both copper and nickel.

Optionally, more than one type of conductive layer can be applied to the honeycomb substrate 52 (step 68). For example, after the initial conductive layer 54 has been applied, one or more additional conductive layers of the same, or different material, can be applied using electroless plating, electrolytic plating, physical vapor deposition, or other methods known to those skilled in the art (step 70). Electrolytic plating would generally be available for applying subsequent conducting layers, as the initial conducting layer would provide the requisite surface conductivity.

In one embodiment, a second conductive layer of nickel is applied over a first conductive layer of copper, the copper providing a relatively high electrical conductivity and the nickel providing a corrosion resistant top coat. As with the initial conductive layer 54, and for similar reasons, the second type of conductive coating can be optionally reapplied until a desired thickness is achieved.

Additional layers of coating or treatment of still other different types of conductive, or even non-conductive materials can be optionally applied to the metallized dielectric honeycomb filter 50 (step 72). For example a fire retardant, a mildew inhibitor, or an anti-corrosion treatment can be applied to the metallized dielectric honeycomb filter 50. These coatings can be selectively applied either covering the entire surface, or any portion thereof. For example, the metallized dielectric honeycomb filter 50 can be completely immersed in a fire retardant, or selectively treated with a corrosion inhibitor, using a masking technique such that a perimeter of the filter 50 remains untreated, thereby avoiding any reduction in the quality of the achievable electrical contact.

Further, the metallized, treated filter 50 can again be shaped, as required, by any of the previously disclosed techniques (step 74). Also, an edge treatment can be optionally applied to the perimeter or mounting surface of the filter 50 (step 76). Particular edge treatments include commercially available EMI gaskets, including metallized spring fingers, conductive fabrics, conductive elastomers, wire mesh, conductive foam, and conductive fabric coated elastomers.

Figure 6B:
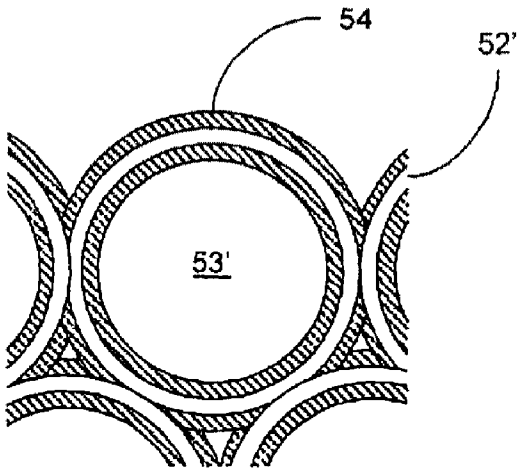
FIG. 6B is an exploded view of a cell from the metallized dielectric honeycomb filter in FIG. 6A.
Figure 6A:
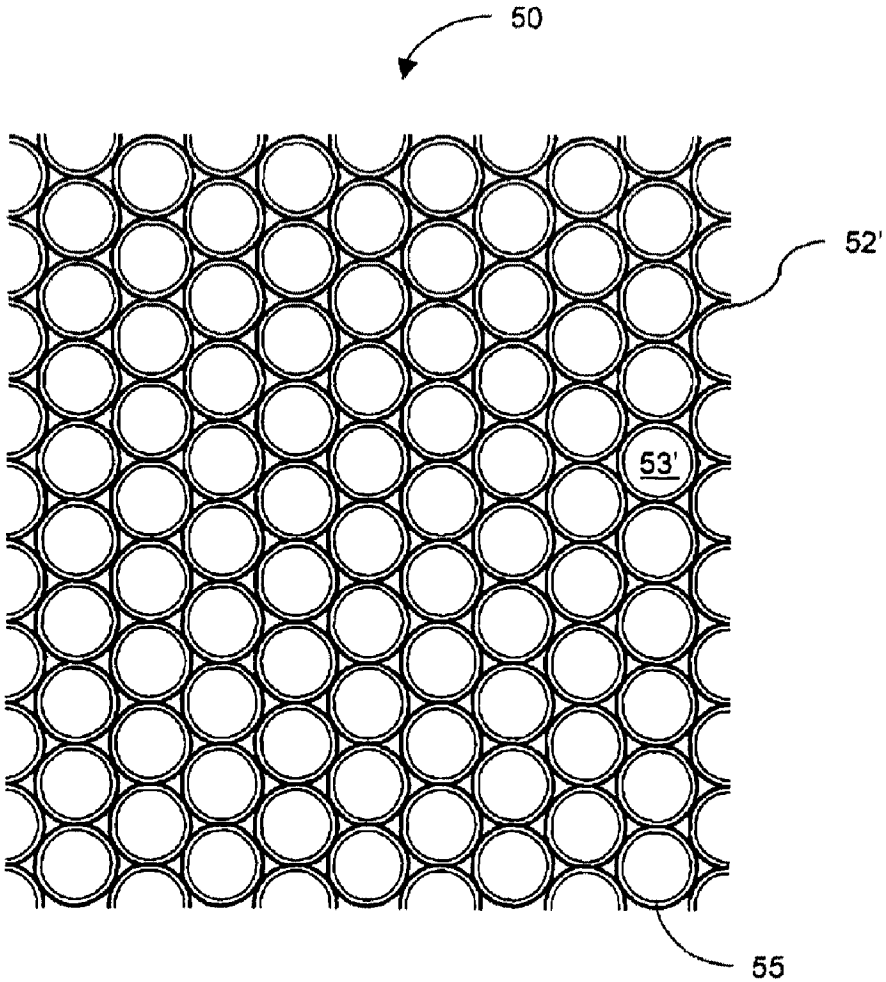
FIG. 6A is a schematic drawing of another metallized dielectric honeycomb filter.

FIG. 6A shows another embodiment of metallized dielectric honeycomb filter 50. In this embodiment, the dielectric honeycomb substrate 52' is formed by a plurality of tubes 55, which can be co-extruded together. In another embodiment, the plurality of tubes 55 can be bonded together. This type of structure could also be produced by injection molding or similar plastic manufacturing processes. The dielectric honeycomb substrate 52' is then metallized as previously described.

FIG. 6B is an exploded view of a cell 53' from FIG. 6A, which shows the conductive layer 54 on the dielectric honeycomb substrate 52' of cell 53'. Again, the conductive layer 54 can be applied by any of the techniques previously described.

In order to provide improved airflow, reduce costs, and simplify manufacture, the metallized dielectric substrate 50, referring again to FIG. 4, does not have a frame, so that a larger percentage of the surface area of the metallized dielectric substrate 50 can accommodate airflow through the opening 18 in the enclosure 20. The metallized dielectric honeycomb filter 50 can be easily cut to fit the size of the opening 18 in the enclosure 20. Alternatively, the dielectric honeycomb substrate 52 can be cut to size prior to adding the conductive layer 54. Cutting the metallized dielectric honeycomb filter 50 through the cells 53 results in partial, open sided honeycomb cells 86 bounded in part by cell walls forming resilient spring fingers 88. The resilient spring fingers 88 elastically deform when the filter 50 is installed so as to both ensure electrical contact with the enclosure 20 and hold the metallized dielectric honeycomb filter 50 firmly in place. Thus, the spring fingers 88 form a conductive edge extending substantially about the perimeter of the filter 50 for placing the filter 50 into electrical communication with the enclosure 20.

The cylindrical tubes 55 that make up the cells 53 of the metallized dielectric honeycomb filter 50, shown in FIG. 6A, can also be made very flexible so as to elastically deform when the metallized dielectric honeycomb filter 50 is installed and thereby ensure electrical contact with the enclosure 20. Electrical contact is ensured with the resilient spring fingers 88' formed by cutting cells 53' on the perimeter of the metallized honeycomb filter 50. In addition, by eliminating the conventional frame, the costs associated with manufacturing the filter are reduced.

The cells 53 can be cut along their diameter, leaving an approximately semicircular cell portion, as shown. Alternatively, the cells 53 can be cut leaving either a greater or lesser amount of the cell wall to form a spring.

Figures 7A, 7B:
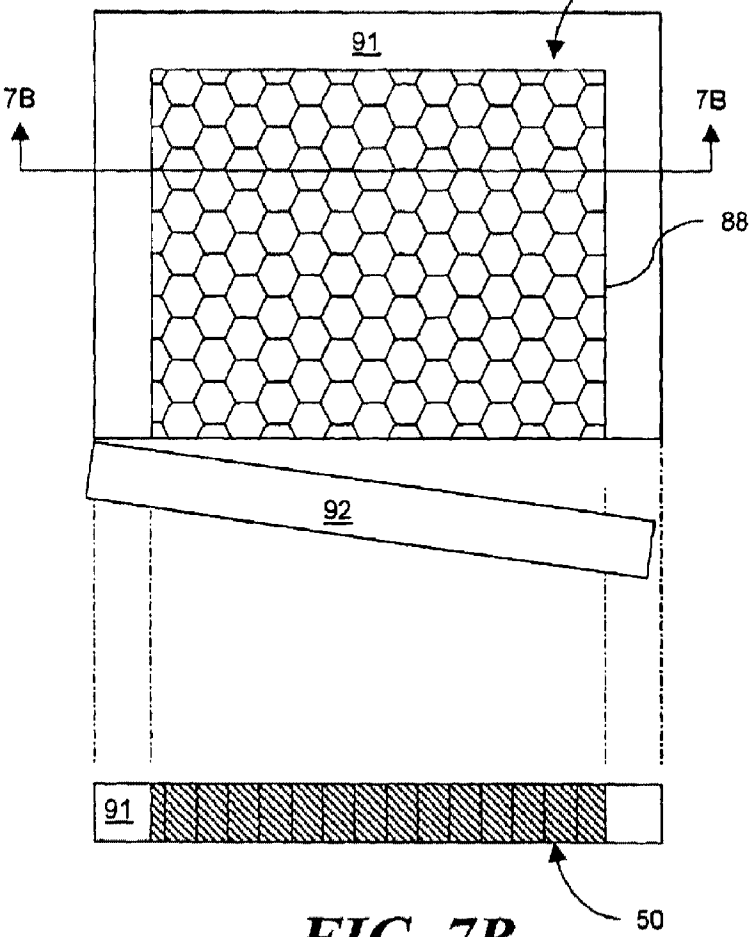
FIG. 7A is a schematic drawing of a metallized dielectric honeycomb filter installed horizontally in an opening in an enclosure for electronic equipment.
FIG. 7B is a cross-section of the metallized dielectric honeycomb filter installed horizontally in an opening in an enclosure for electronic equipment taken along section 7B-7B of FIG. 7A.

FIG. 7A shows how the metallized dielectric honeycomb filter 50 would be installed in a channel 91 located in an electronics cabinet in a horizontal mounting configuration. A door member or final cap 92 encloses the metallized dielectric honeycomb filter 50 in the channel 91. In this configuration, all of the mounting surfaces of the cabinet and vent panel are orthogonal. The metallized dielectric honeycomb filter 50 can be sized such that the resilient spring fingers 88 elastically deform and fit snugly in the channel 91 to ensure a tight fit and good electrical contact. By using the channel 91 integrally formed in the enclosure 20, the need for a separate EMI gasket between the filter 50 and enclosure 20 is eliminated. FIG. 7B is a cross-section of the metallized dielectric honeycomb filter 50 installed horizontally in the opening in an enclosure for electronic equipment taken along section 7B-7B of FIG. 7A.

Figure 7F:
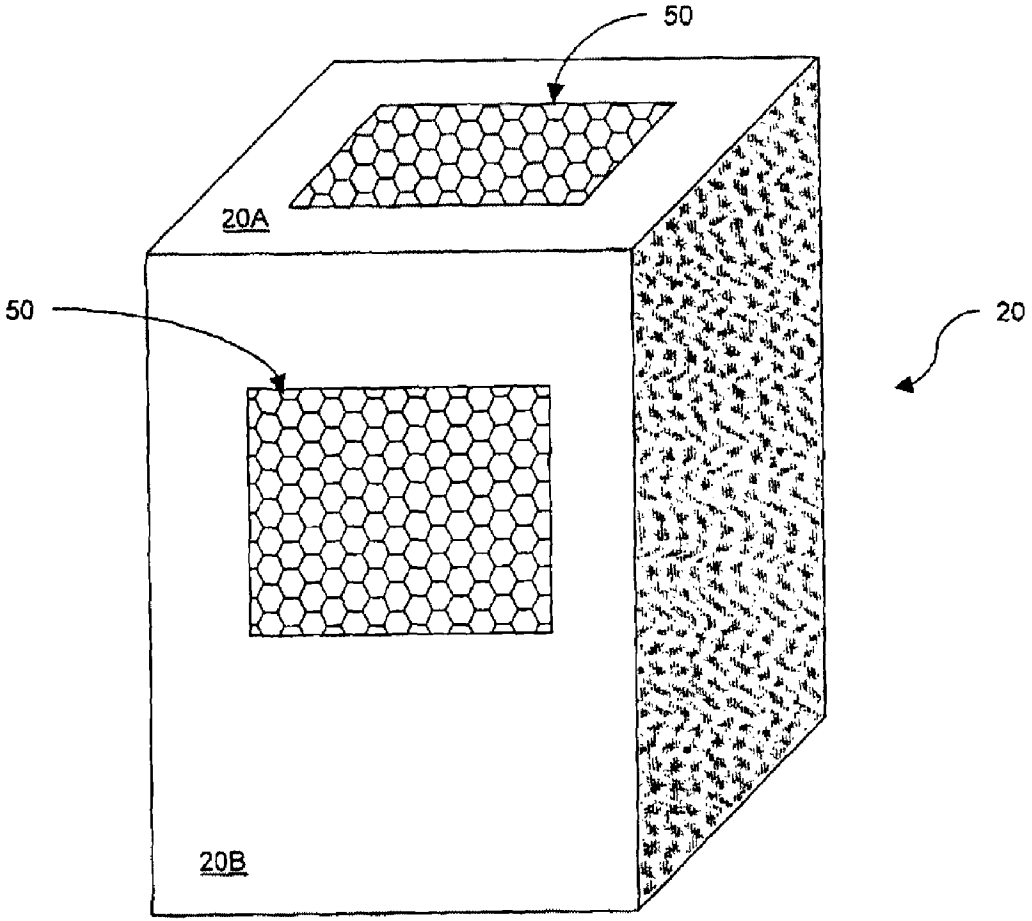
FIG. 7F is a schematic drawing of metallized dielectric honeycomb filters, angled in the thickness direction, installed vertically and another filter installed horizontally in an enclosure for electronic equipment.

In yet other embodiments, shown in FIG. 7C-7I, the opening 18 can be tapered either vertically (having different surface areas comparing from top to bottom), or horizontally (having different width measurements comparing the front and rear edges). In a vertical configuration, shown in FIG. 7C, the frameless metallized dielectric honeycomb filter 50 will have a taper along its thickness, which would be similar to the taper in the cabinet wall. The metallized dielectric honeycomb filter 50 would be inserted into the tapered cabinet opening (alternatively, the cabinet can include non-tapered, or straight edges) at about a 90 degree angle to the plane of the opening until an intimate compression fit (similar to a cork) is achieved. Stops can optionally be placed above and/or below the vent panel to keep it in place during usage. FIG. 7D illustrates a cross-section of the metallized dielectric honeycomb filter 50, angled in the thickness direction, installed vertically in an opening in an enclosure for electronic equipment taken along section 7D-7D of FIG. 7C. FIG. 7E illustrates an alternative embodiment in which the perimeter of the filter 50' is shaped to provide a rabbet edge 94 to accommodate a suitable mating surface 91'. Again, stops can optionally be placed above the vent panel to keep it in place during usage. FIG. 7F shows the metallized dielectric honeycomb filter 50, with taper or a rabbet along its thickness, installed on the top surface 20A, and a wall 20B of an electronic equipment enclosure 20.

Figures 7G, 7H:
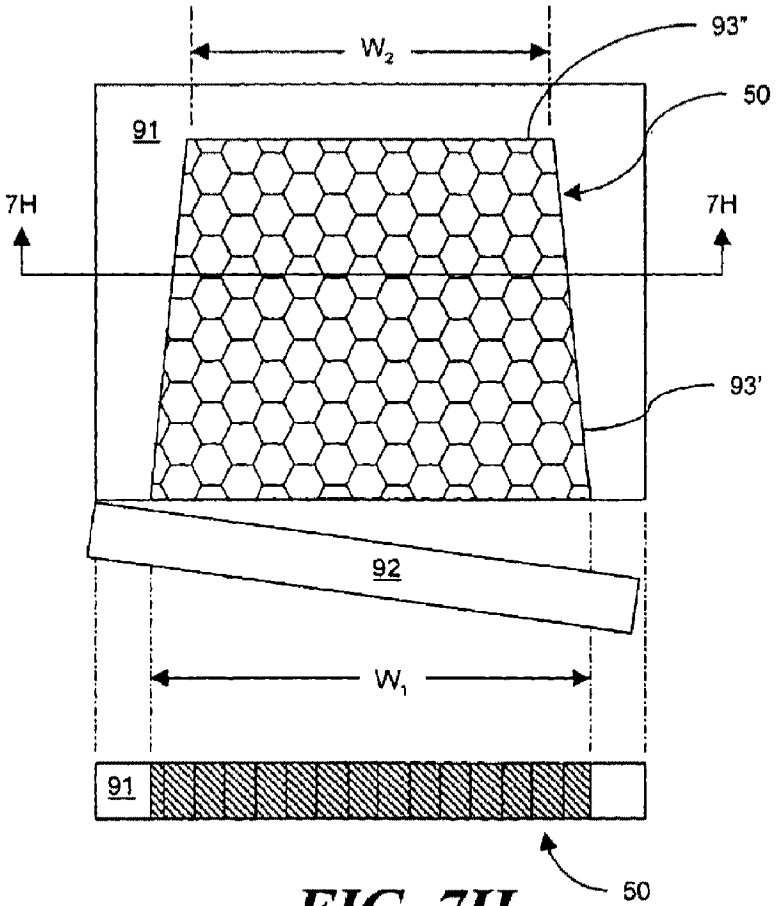
FIG. 7G is a schematic drawing of a tapered metallized dielectric honeycomb filter installed horizontally in an opening in an enclosure for electronic equipment.
FIG. 7H is a cross-section of the tapered metallized dielectric honeycomb filter installed horizontally in an opening in an enclosure for electronic equipment taken along section 7H-7H of FIG. 7G.
Figure 7I:
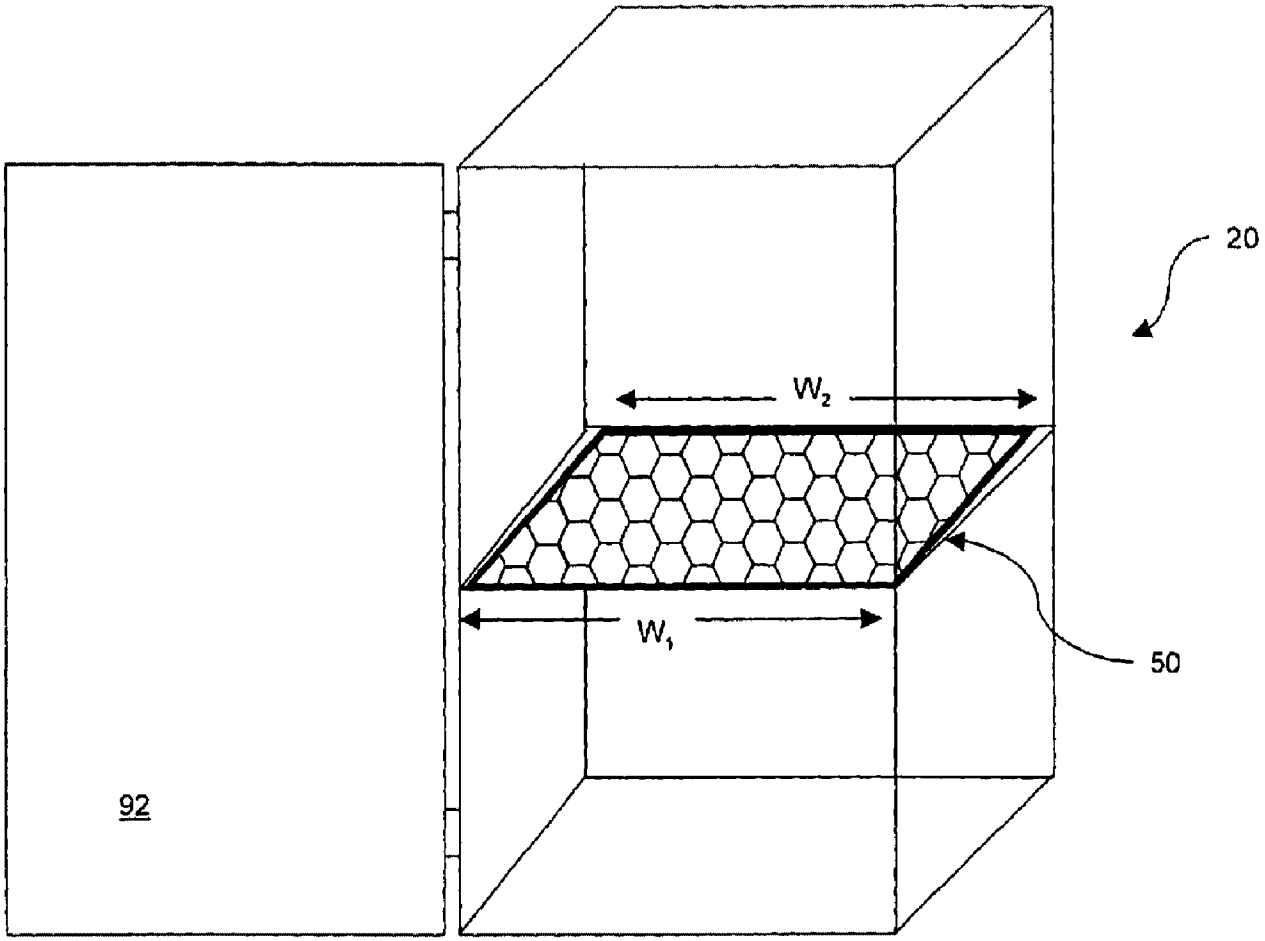
FIG. 7I is a schematic drawing of a tapered metallized honeycomb filter installed horizontally in one opening in an enclosure for electronic equipment.

FIG. 7G shows the horizontal configuration, where the frameless metallized dielectric honeycomb filter 50 will have a taper along its length, which is similar to a taper in a cabinet channel 91 adapted for receiving a tapered filter 50. As illustrated, the filter 50 has a first width $W_1$ along a front edge, and a different second width, $W_2$, along a rear edge. The metallized dielectric honeycomb filter 50 is inserted into the cabinet channel 91 in the place of the filter and along the channel axis until the metallized dielectric honeycomb filter 50 is snug along both side walls 93' and rear wall 93". A final cap or door member 92 can be clamped or otherwise attached over the metallized dielectric honeycomb filter 50 to seal the final side. FIG. 7H illustrates a cross-section of the tapered metallized dielectric honeycomb filter 50 installed horizontally in an opening in an enclosure for electronic equipment taken along section 7H-7H of FIG. 7G. FIG. 7I illustrates a metallized dielectric honeycomb filter 50 with a taper along its length installed in an electronic equipment enclosure 20.

In other embodiments, shown in FIGS. 8A-8M, a band frame or slim profile frame 96', 96", 96''', 96'''', generally 96, is added to the metallized dielectric honeycomb filter 50. In the band frame configuration, shown in FIGS. 8A-8M, a flat metal strip 98', 98", 98''', 98'''', generally 98, with numerous spring fingers 100', 100", generally 100, (FIGS. 8A-8E) or dimples 101', 101", generally 101, (FIGS. 8F-8J) along its length is wrapped tightly around the perimeter of the metallized dielectric honeycomb filter 50 on its thickness side forming a band 96', 96", 96''', 96'''' generally 96. The band 96 on its interior, flat side, compresses the metallized dielectric honeycomb filter 50 along its thickness to create good electrical contact, while the spring fingers 100/dimples 101 on the opposite, exterior side of the band 96 make good electrical contact with the cabinet (generally attaining a resistance value below some predetermined desirable threshold value). The features on the band 96 are oriented appropriately depending on whether the metallized dielectric honeycomb filter 50 is inserted vertically (FIGS. 8D and 8E) or horizontally (FIGS. 8B and 8C) with respect to a cabinet opening. The benefit of this band frame 96 is that it leaves the airflow surface of the metallized dielectric honeycomb filter 50 virtually unblocked while increasing the flexibility of the vent panel.

FIG. 8B is a schematic drawing illustrating a front view of one side of the band frame [96] *96'* of FIG. 8A, where the band frame has horizontal spring fingers 100'. FIG. 8C is a schematic drawing illustrating a side view of one side of the band frame 96' of FIG. 8A. Similarly, FIG. 8D is a schematic drawing illustrating a front view of a band frame 96" (not shown with metallized dielectric honeycomb filter 50), where the band frame has vertical spring fingers 100", attached, for example, to a band 98 at one end and oriented for vertical insertion. FIG. 8E is a schematic drawing illustrating a side view of the band frame 96" of FIG. 8D.

Figures 8F, 8G, 8H, 8I, 8J:
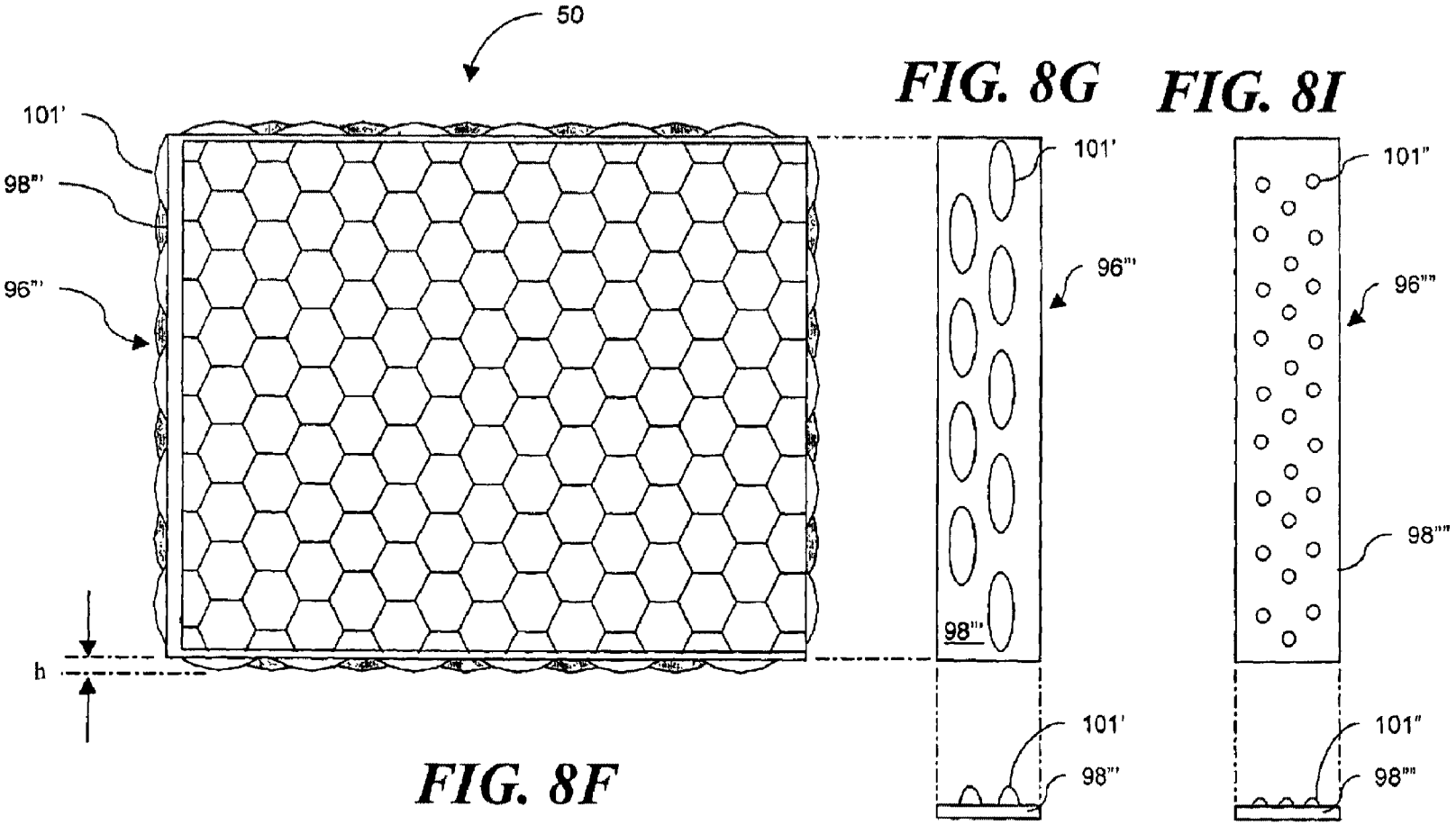
FIG. 8F is a schematic drawing illustrating a top view of a band frame surrounding a metallized dielectric honeycomb vent panel in which the band frame has elongated dimples.
FIG. 8G is a schematic drawing illustrating a front view of the band frame in which the band frame has elongated dimples.
FIG. 8H is a schematic drawing illustrating a side view of the band frame in which the band frame has elongated dimples.
FIG. 8I is a schematic drawing illustrating a top view of an alternative band frame surrounding a metallized dielectric honeycomb vent panel in which the band frame has circular dimples.
FIG. 8J is a schematic drawing illustrating a front view of the alternative band frame in which the band frame has circular dimples.

FIG. 8G is a schematic drawing illustrating a front view of the band frame 96''' of FIG. 8F, where the band frame 96''' has elongated conductive protrusions, or dimples 101', extending outward from the perimeter. FIG. 8H is a schematic drawing illustrating a side view of the band frame 96''' of FIG. 8H in which the band frame 96''' has elongated dimples 101'. Similarly, FIG. 8I is a schematic drawing illustrating a front view of a band frame 96'''' (not shown with metallized dielectric honeycomb filter 50), where the band frame 96'''' has circular dimples 101" formed, for example, within a band 98''''. FIG. 8H is a schematic drawing illustrating a side view of the band frame 96'''' of FIG. 8I.

Figures 8K, 8L, 8M:
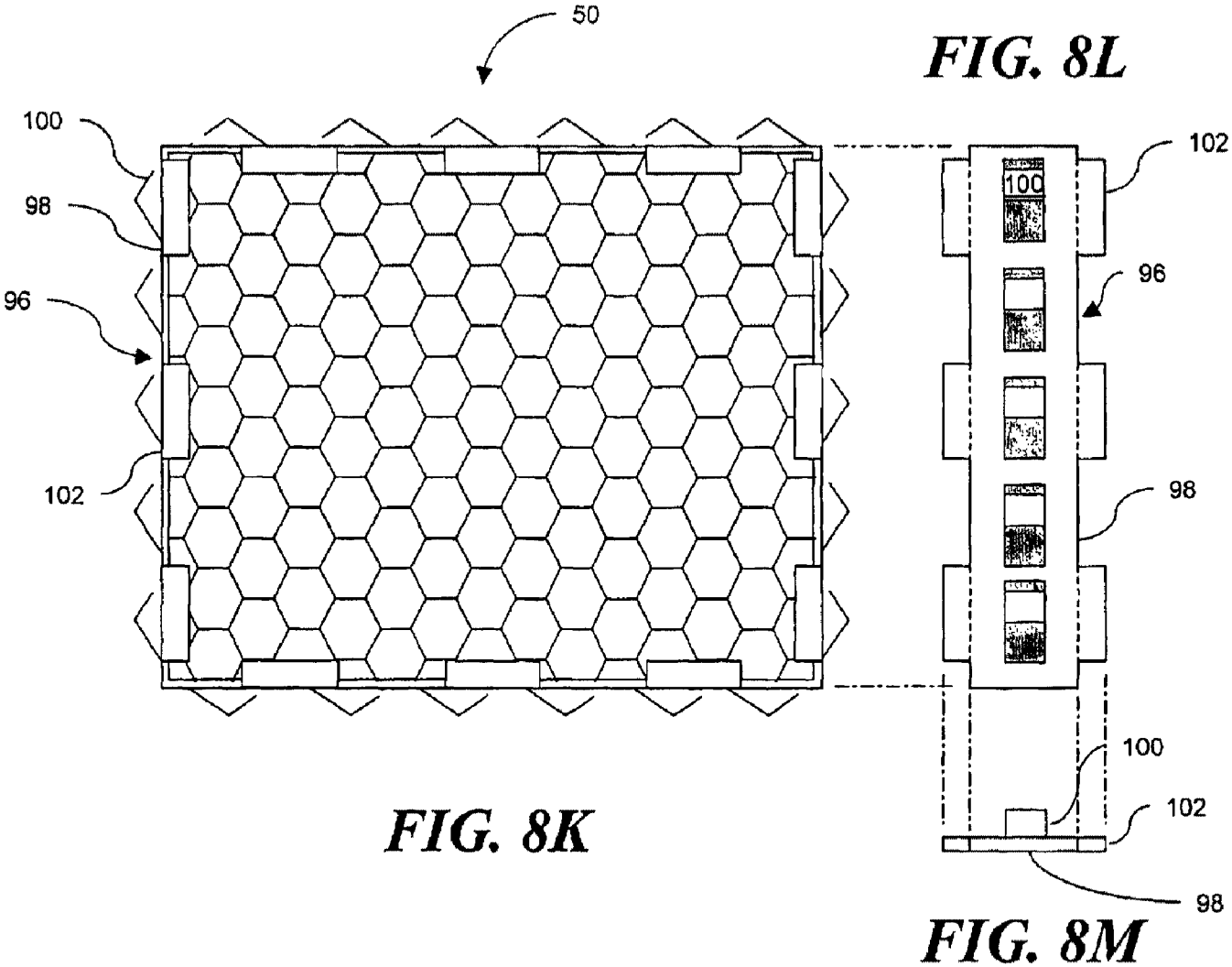
FIG. 8K is a schematic drawing illustrating a top view of a metallized dielectric honeycomb vent panel surrounded by a slim profile frame in which the frame has small horizontal edge tabs and spring fingers.
FIG. 8L is a schematic drawing illustrating a front view of the slim profile frame in which the frame has small horizontal edge tabs and spring fingers.
FIG. 8M is a schematic drawing illustrating a side view of the slim profile frame in which the frame has small horizontal edge tabs and spring fingers.

In yet another embodiment, in a slim frame configuration, shown in FIG. 8K, the band [99] *98* uses a band frame 96 and incorporates narrow features or tabs 102 that wrap around the metallized dielectric honeycomb filter 50 on its top and/or bottom surface a small amount, such as less than about 0.25 inch. Additionally, the tabs 102 can be cut away in substantial areas, such that they only wrap around portions of the metallized dielectric honeycomb filter 50 on its top and/or bottom surface. This embodiment provides additional support for the metallized dielectric honeycomb filter 50 while only reducing the airflow surface by a small amount.

FIG. 8L is a schematic drawing illustrating a front view of one side of the band frame 96 of FIG. 8K, where the band frame has tabs 102 that are fashioned to bend such that when bent inward 90 degrees about either surface of the filter 50, the tabs secure the band frame 96 to the filter 50. FIG. 8M is a schematic drawing illustrating a side view of one side of the band frame 96 of FIG. 8L.

In yet further embodiments, the band frame 96 may be constructed from any conductive material that maintains maximum air flow area through the dielectric honeycomb filter 50, but in addition to being electrically conductive, can also help to accommodate variations in dimensional tolerances during insertion of the dielectric honeycomb filter 50 into the cabinet 20. Dimensional tolerances between the dielectric honeycomb filter 50 and the enclosure 20 can be accommodated, for example, by using conductive foam, conductive fabric, or conductive fabric wrapped foam for the band material. These band materials create good electrical contact just like a metal band, but unlike a metal band, these band materials have a much lower compression force and are more compliant allowing them to readily accommodate tolerance variations between the metallized dielectric honeycomb filter 50 and the cabinet 20. Conductive fabric wrapped foams and conductive foams can be obtained from Laird Technologies, Inc., located in Delaware Water Gap, Pa.

Figure 9:
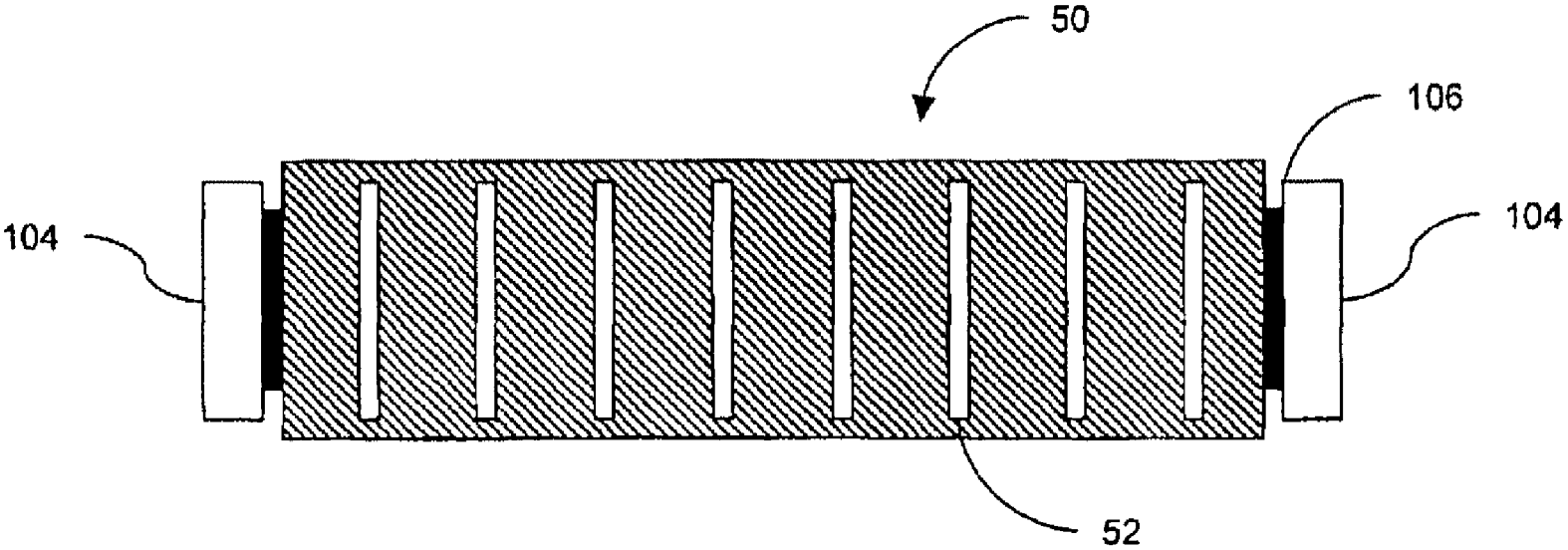
FIG. 9 is a schematic drawing illustrating a side view of an embodiment of a metallized dielectric honeycomb vent panel surrounded by a compressible elastomer EMI gasket.

In one embodiment, illustrated in FIG. 9, the conductive foam or the conductive fabric wrapped foams 104 for use as a band 98 can be slit or manufactured into strips that are approximately as wide or wider as the metallized dielectric honeycomb filter 50 is thick. The strips of these band materials 104 can then be applied to the perimeter of the metallized dielectric honeycomb filter 50 by using an adhesive attachment method, such as pressure sensitive adhesive or glue 106, to form a complete band around the periphery of the metallized dielectric honeycomb filter 50. The thicknesses of these band materials can vary from about 0.5 millimeter to about 10 millimeter, or as needed to fill the gaps between the metallized dielectric honeycomb filter 50 and the enclosure 20. These band materials 104 have the advantages of being electrically conductive, flexible and easily compressed, making them useful as an EMI seal/gasket between the metallized dielectric honeycomb filter 50 and the cabinet 20. This allows the EMI radiation induced electrical currents to flow readily from the metallized dielectric honeycomb filter 50 through the band material, to the cabinet 20, and then finally to ground. The compressible foam material fills the gaps and maintains a good compression fit between the metallized dielectric honeycomb filter 50 and the cabinet 20, while sealing any surface discontinuities, seams, and gaps that could act as EMI leakage points.

As readily understood by those skilled in the art, many different configurations can be used to contain the metallized dielectric honeycomb filter 50 in the enclosure 20.

The metallized dielectric honeycomb filter 50 provides improved airflow while meeting stringent flammability standards. [Once] *One* such flammability standard is the UL94 Vertical Flame Test, described in detail in Underwriter Laboratories Standard 94 entitled "Tests for Flammability of Plastic Materials for Parts in Devices and Appliances," $5^{th}$ Edition, 1996, the disclosure of which is incorporated herein by reference in its entirety. The metallized dielectric vent panels 50 according to the invention are able to achieve V0 flame rating, as well as V1 and V2 vertical ratings described in the standard.

Figure 10:
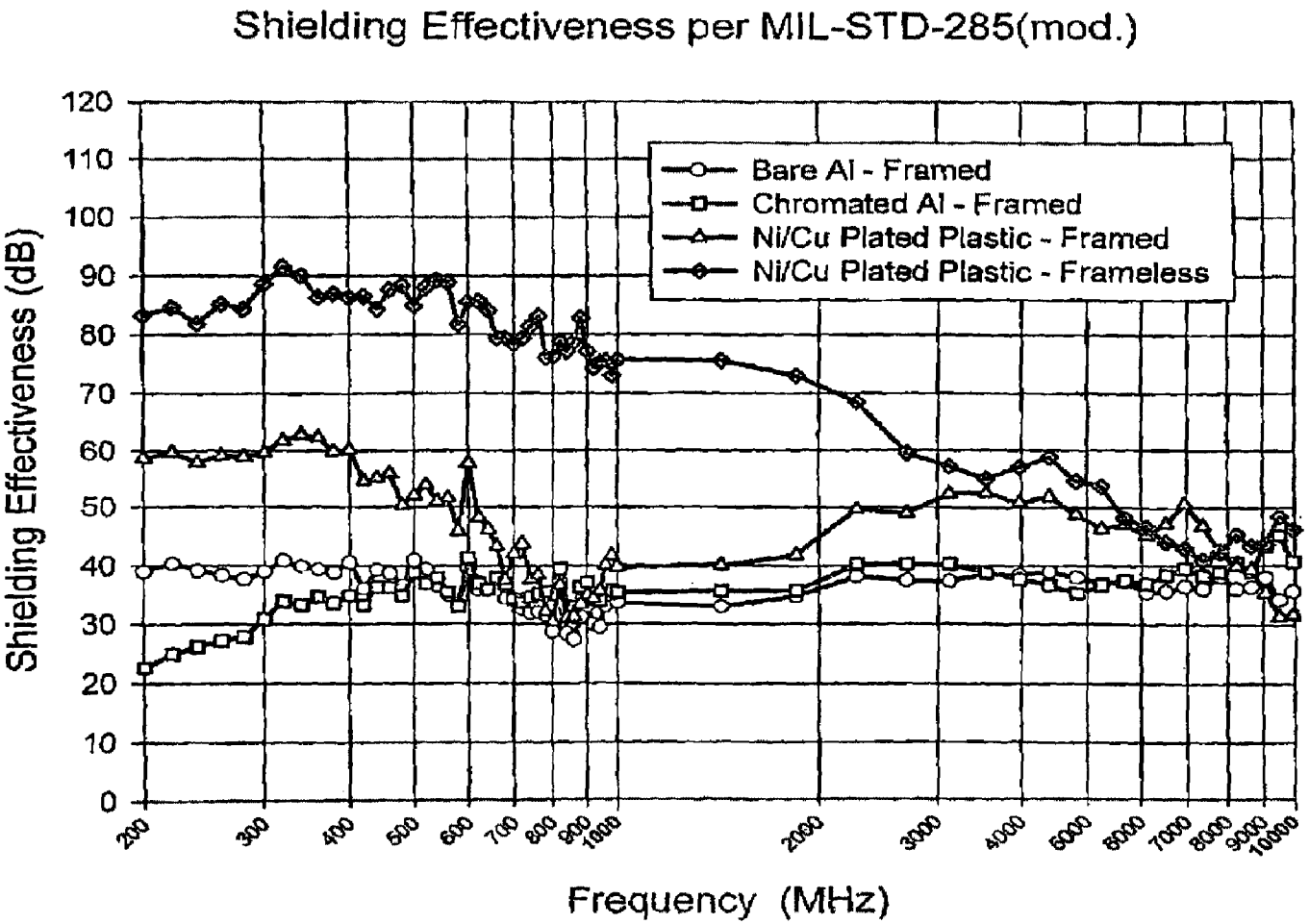
FIG. 10 is a plot of EMI shielding test results for metallized dielectric honeycomb filters in accordance with certain embodiments of the invention.
Figure 11:
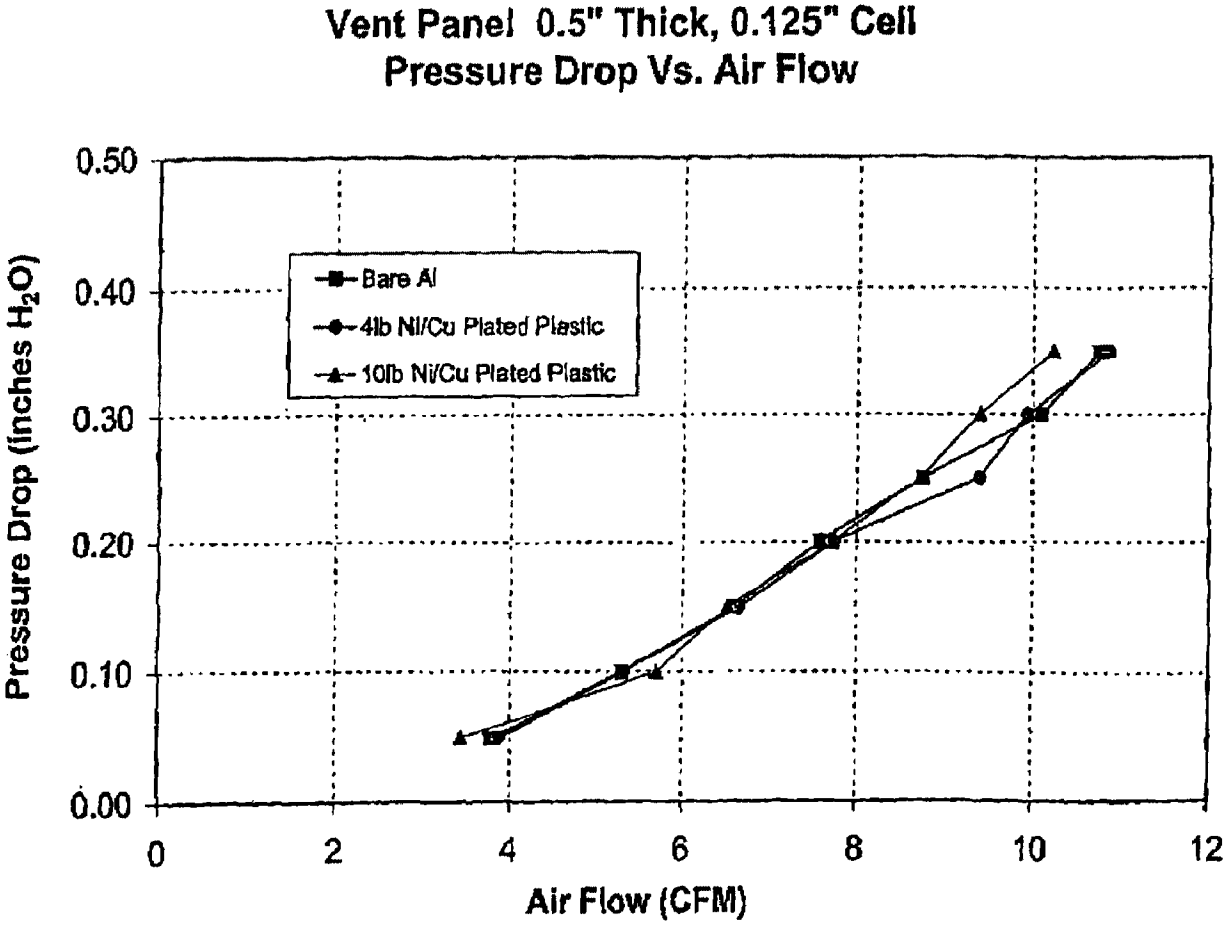
FIG. 11 is a plot of airflow test results for metallized dielectric honeycomb filters in accordance with certain embodiments of the invention.

EMI shielding effectiveness and airflow test data for a metallized dielectric honeycomb filter in accordance with certain embodiments of the invention are shown respectively in FIGS. 10 and 11. The filter tested for shielding effectiveness is made of a polycarbonate polymer with a plating of nickel over copper. The test panel is about 0.5 inches thick, with a cell size of about 0.125 inches, and a density of about 4 lb/ft$^3$. The nickel layer is about 5-10 micro inches thick and was applied by electroless plating. The copper layer is about 20-50 micro inches thick and was applied by electroless plating. FIG. 10 shows that in the frameless configuration, the metallized dielectric honeycomb filter provides a range of about 80-90 dB of shielding effectiveness up to 1 GHz. In the framed configuration, the nickel over copper metallized dielectric honeycomb filter provides a range of about 40-60 dB of shielding effectiveness up to 1 GHz. FIG. 10 also provides test results for traditional aluminum honeycomb vent panels with different finishes (bare and chromated). The aluminum vent panels with no plating and with chromate finish provide only 30-40 dB of shielding effectiveness up to 1 GHz.

The filters tested for airflow effectiveness are the standard aluminum honeycomb and two different polycarbonate polymer honeycombs with a plating of nickel over copper in accordance with the invention. The test panels were about 0.5 inch thick with a cell size of about 0.125 inch. One of the dielectric honeycomb panels had a density of about 4 lb/ft$^3$ and the other dielectric honeycomb panel had a density of about 10 lb/ft$^3$. FIG. 11 shows that there is substantially no difference in airflow characteristics between standard aluminum honeycomb of the same thickness and cell size and the 4 or 10 lb/ft$^3$ density of the metallized dielectric honeycomb. All of the air flow testing was conducted on the honeycomb without the presence of a frame, so that the results represent the air flow performance of the honeycomb materials.

Accordingly, vent panels produced in accordance with the invention can yield significantly improved shielding effectiveness for the same airflow characteristics as conventional metal vent panels.

Variations, modifications, and other implementations of what is described herein will occur to those of ordinary skill in the art without departing from the spirit and the scope of the invention as claimed. The various features and configurations shown and equivalents thereof can be used in various combinations and permutations. Accordingly, the invention is to be defined not by the preceding illustrative descriptions, but instead by the following claims.

What is claimed is:

[1. A frameless vent panel adapted to shield against electromagnetic interference (EMI) comprising:

a dielectric panel having a thickness defined by a first side and a second side, and defining a plurality of apertures, said dielectric panel further having a perimeter;

a first electrically conductive layer applied to the dielectric pane, wherein the conductively coated dielectric panel attenuates a transfer of electromagnetic energy from the first side to the second side of the substrate; and a strip of compressible conductive foam material, said strip having a width substantially equal to the thickness of said dielectric panel and being wrapped around the perimeter thereof and substantially covering said thickness between said first side and said second side.]

[2. The frameless vent panel of claim 1, wherein the dielectric panel is of a polymer.]

[3. The frameless vent panel of claim 1, wherein the dielectric panel is of a material selected from the group consisting of polycarbonate, polypropyle , acrylonitrile-butadiene-styrene (ABS), polyethylene, polyvinyl chloride (PVC), carbon, fiberglass, paper and combinations thereof.]

[4. The frameless vent panel of claim 1, wherein the dielectric panel comprises a plurality of tubes bonded together.]

[5. The frameless vent panel of claim 1, wherein the dielectric panel comprises a plurality of tubes co-extruded together.]

[6. The frameless vent panel of claim 1, wherein the dielectric panel is produced using an injection molding process.]

[7. The frameless vent panel of claim 1, wherein the dielectric panel comprises a plurality of corrugated dielectric sheets bonded together, wherein the bonded corrugated dielectric sheets define the plurality of apertures.]

[8. The frameless vent panel of claim 1, wherein the electrically conductive layer is of a material selected from the group consisting of copper, nickel, tin, aluminum, silver, gold, graphite, lead, palladium, cadmium, zinc and combination thereof.]

[9. The frameless vent panel of claim 1, further comprising a second electrically conductive layer in electrical communication with the first electrically conductive layer.]

[10. The frameless vent panel of claim 1, wherein the plurality of apertures is configured as a two-dimensional array of like apertures.]

[11. The frameless vent panel of claim 10, wherein a cross-sectional shape of each of the like apertures is a shape selected from the group consisting of circular, elliptical, hexagonal, square, rectangular, triangular, rhomboidal, and combinations thereof.]

[12. The frameless vent panel of claim 1, wherein a cross-sectional diameter of each of the like apertures is selected to be between about 0.06 inches and 1 inch.]

[13. The frameless vent panel of claim 1, wherein the dielectric panel is selected to have a density of between about 2 lb/ft$^3$ and about 20 lb/ft$^3$.]

[14. The frameless vent panel of claim 1, wherein the vent panel provides at least about 20 dB of attenuation to EMI at $10^9$ Hz.]

[15. The frameless vent panel of claim 1, wherein said strip compressible conductive foam is secured to said dielectric panel with an adhesive.]

[16. The frameless vent panel of claim 1, wherein said strip of compressible conductive foam has a thickness in a range from about 0.5 millimeter to about 10 millimeters.]

*17. A frameless vent panel for providing electromagnetic interference (EMI) shielding for a ventilation opening of an electronic enclosure, the frameless vent panel comprising:*

*a dielectric panel having a thickness defined by a first side and a second side, a perimeter, and a plurality of apertures extending from the first side to the second side for allowing airflow therethrough;*

*at least one electrically-conductive material provided to the dielectric panel for attenuating a transfer of electromagnetic energy from the first side to the second side; and*

*a resiliently compressible electrically-conductive edge substantially about the perimeter of the frameless vent panel and substantially covering said thickness between said first side and said second side, for compressively fitting the frameless vent panel within the ventilation opening in electrical communication with the electronic enclosure.*

*18. The frameless vent panel of claim 17, wherein the resiliently compressible electrically-conductive edge is configured for allowing the frameless vent panel to be compressively fit and retained within the ventilation opening without using any mechanical fasteners.*

*19. The frameless vent panel of claim 17, wherein the resiliently compressible electrically-conductive edge is configured for allowing the frameless vent panel to be compressively fit and retained within the ventilation opening in a direction normal to the longitudinal axes of the apertures.*

*20. The frameless vent panel of claim 17, wherein the resiliently compressible electrically-conductive edge comprises a band of one or more materials, the band having a width substantially equal to the thickness of the dielectric panel and being wrapped around the perimeter of the dielectric panel such that the band substantially covers the thickness defined between the first side and the second side.*

*21. The frameless vent panel of claim 20, wherein the band of one or more materials comprises at least one or more of electrically-conductive foam, electrically-conductive fabric, and electrically-conductive fabric wrapped over foam.*

*22. The frameless vent panel of claim 17, wherein the resiliently compressible electrically-conductive edge comprises electrically-conductive fabric.*

*23. The frameless vent panel of claim 17, wherein the resiliently compressible electrically-conductive edge comprises electrically-conductive fabric wrapped over foam.*

*24. The frameless vent panel of claim 17, wherein the resiliently compressible electrically-conductive edge comprises electrically-conductive foam.*

*25. The frameless vent panel of claim 17, wherein the resiliently compressible electrically-conductive edge comprises a resiliently compressible EMI gasket having a width substantially equal to the thickness of the dielectric panel, the resiliently compressible EMI gasket being wrapped around the perimeter of the dielectric panel such that the resiliently compressible EMI gasket substantially covers the thickness defined between the first side and the second side.*

*26. The frameless vent panel of claim 17, wherein the resiliently compressible electrically-conductive edge comprises electrically-conductive elastomer.*

*27. The frameless vent panel of claim 17, wherein the resiliently compressible electrically-conductive edge comprises electrically-conductive protrusions extending outwardly substantially about the perimeter.*

*28. The frameless vent panel of claim 27, wherein the electrically-conductive protrusions comprise at least one or more of a resilient spring finger, a dimple, or a combination thereof.*

*29. The frameless vent panel of claim 17, wherein the resiliently compressible electrically-conductive edge comprises electrically-conductive wire mesh.*

*30. The frameless vent panel of claim 17, wherein the resiliently compressible electrically-conductive edge comprises electrically-conductive material disposed over a resiliently compressible member.*

*31. The frameless vent panel of claim 17, wherein the resiliently compressible electrically-conductive edge comprises electrically-conductive fabric applied to an elastomer.*

*32. The frameless vent panel of claim 17, wherein the openings have a honeycomb configuration.*

*33. The frameless vent panel of claim 17, further comprising flame retardant provided to the conductively coated dielectric panel for achieving a flame rating of V0 under Underwriter's Laboratories (UL) Standard No. 94.*

*34. The frameless vent panel of claim 17, further comprising a corrosion inhibitor provided to the conductively coated dielectric panel.*

*35. A frameless vent panel for providing electromagnetic interference (EMI) shielding for a ventilation opening of an electronic enclosure, the frameless vent panel comprising:*

*a frameless dielectric panel having a thickness defined by a first side and a second side, a perimeter, and a plurality of apertures extending from the first side to the second side for allowing airflow therethrough;*

*at least one electrically-conductive material provided to the frameless dielectric panel for attenuating a transfer of electromagnetic energy from the first side to the second side; and*

*a resiliently compressible EMI gasket having a width substantially equal to the thickness of the frameless dielectric panel, the resiliently compressible EMI gasket being wrapped around the perimeter of the frameless dielectric panel and substantially covering the thickness defined between the first side and the second side.*

*36. The frameless vent panel of claim 35, wherein the resiliently compressible EMI gasket comprises electrically-conductive fabric wrapped over foam.*

*37. The frameless vent panel of claim 35, wherein the resilient compressible EMI gasket comprises electrically-conductive material coupled to a resiliently compressible member.*

*38. A frameless vent panel for providing electromagnetic interference (EMI) shielding for a ventilation opening of an electronic enclosure, the frameless vent panel comprising:*

*a dielectric panel having a thickness defined by a first side and a second side, a perimeter, and a plurality of apertures extending from the first side to the second side for allowing airflow therethrough;*

*at least one electrically-conductive material provided to the dielectric panel for attenuating a transfer of electromagnetic energy from the first side to the second side; and*

*means for compressively fitting and retaining the frameless vent panel within the ventilation opening and for placing the frameless vent panel in electrical communication with the electronic enclosure,*

*said means disposed substantially about the perimeter of the frameless vent panel with said means substantially covering the thickness defined between the first side and the second side.*

*39. An electronic enclosure comprising:*

*a ventilation opening;*

*a frameless vent panel within the ventilation opening for providing electromagnetic interference (EMI) shielding, the frameless vent panel including:*

*a dielectric panel having a thickness defined by a first side and a second side, a perimeter, and a plurality of apertures extending from the first side to the second side for allowing airflow therethrough;*

*at least one electrically-conductive material provided to the dielectric panel for attenuating a transfer of electromagnetic energy from the first side to the second side; and*

*a resiliently compressible electrically-conductive edge substantially about the perimeter of the frameless vent panel and substantially covering the thickness defined between the first side and the second side, the resiliently compressible electrically-conductive edge compressively retaining the frameless vent panel within the ventilation opening in electrical communication with the electronic enclosure.*

*40. The electronic enclosure of claim 39, wherein the frameless vent panel is compressively retained within the ventilation opening by the resiliently compressible electrically-conductive edge without using any mechanical fasteners.*

*41. The electronic enclosure of claim 39, wherein the resiliently compressible electrically-conductive edge is compressed within the ventilation opening in a direction normal to the longitudinal axes of the apertures.*

*42. The electronic enclosure of claim 39, wherein the resiliently compressible electrically-conductive edge comprises a band of one or more materials, the band having a width substantially equal to the thickness of the dielectric panel and being wrapped around the perimeter of the dielectric panel such that the band substantially covers the thickness defined between the first side and the second side.*

*43. The electronic enclosure of claim 42, wherein the band of one or more materials comprises at least one or more of electrically-conductive foam, electrically-conductive fabric, and electrically-conductive fabric wrapped over foam.*

*44. The electronic enclosure of claim 39, wherein the resiliently compressible electrically-conductive edge comprises electrically-conductive fabric wrapped over foam.*

*45. The electronic enclosure of claim 39, wherein the resiliently compressible electrically-conductive edge comprises a resiliently compressible EMI gasket having a width substantially equal to the thickness of the dielectric panel and being wrapped around the perimeter of the dielectric panel such that the resiliently compressible EMI gasket substantially covers the thickness defined between the first side and the second side.*

*46. A method for electromagnetic interference (EMI) shielding a ventilation opening of an electronic enclosure, the method comprising positioning a frameless metallized dielectric vent panel within the ventilation opening such that the frameless metallized dielectric vent panel is compressively retained within the ventilation opening by a resiliently compressible electrically-conductive edge disposed substantially about the perimeter of the frameless metallized dielectric vent panel and substantially covering the thickness defined between a first side and a second side of the frameless metallized dielectric vent panel, and such that the resiliently compressible electrically-conductive edge places the frameless metallized dielectric vent panel in electrical communication with the electronic enclosure.*

*47. The method of claim 46, wherein the frameless metallized dielectric vent panel is compressively retained within the ventilation opening by the resiliently compressible electrically-conductive edge without using any mechanical fasteners.*

*48. The method of claim 46, wherein the frameless metallized dielectric vent panel includes a plurality of apertures extending from the first side to the second side for allowing airflow therethrough, and wherein positioning the frameless metallized dielectric vent panel within the ventilation opening includes compressing the resiliently compressible electrically-conductive edge within the ventilation opening in a direction generally perpendicular to the longitudinal axes of the apertures.*

*49. A method of making a frameless vent panel capable of providing electromagnetic interference (EMI) shielding for a ventilation opening of an electronic enclosure, the method comprising providing a frameless metallized dielectric vent panel with a resiliently compressible electrically-conductive edge substantially about a perimeter of the frameless metallized dielectric vent panel such that the resiliently compressible electrically-conductive edge substantially covers a thickness defined between a first side and a second side of the frameless metallized dielectric vent panel, the resiliently compressible electrically-conductive edge being configured for allowing the frameless vent panel to be compressively fit and retained within the ventilation opening in electrical contact with the electronic enclosure.*

*50. The method of claim 49, further comprising metalizing a dielectric panel to thereby create the frameless metallized dielectric vent panel before providing the frameless metallized dielectric vent panel with the resiliently compressible electrically-conductive edge.*

*51. The method of claim 49, wherein providing the frameless metallized dielectric vent panel with the resiliently compressible electrically-conductive edge comprises positioning a band of one or more materials about the perimeter of the frameless metallized dielectric vent panel such that the band of one or more materials substantially covers the thickness defined between the first side and said second side.*

*52. The method of claim 51, wherein the band of one or more materials comprises at least one or more of electrically-conductive foam, electrically-conductive fabric, and electrically-conductive fabric wrapped over foam.*

*53. The method of claim 49, wherein providing the frameless metallized dielectric vent panel with the resiliently compressible electrically-conductive edge comprises positioning electrically-conductive fabric wrapped over foam about the perimeter of the frameless metallized dielectric vent panel such that the electrically-conductive fabric wrapped over foam substantially covers the thickness defined between the first side and said second side.*

*54. The method of claim 50, wherein providing the frameless metallized dielectric vent panel with the resiliently compressible electrically-conductive edge comprises positioning electrically-conductive fabric about the perimeter of the frameless metallized dielectric vent panel such that the electrically-conductive fabric substantially covers the thickness defined between the first side and said second side.*

*55. The method of claim 49, wherein providing the frameless metallized dielectric vent panel with the resiliently compressible electrically-conductive edge comprises positioning electrically-conductive foam about the perimeter of the frameless metallized dielectric vent panel such that the electrically-conductive foam substantially covers the thickness defined between the first side and said second side.*

*56. The method of claim 49, wherein providing the frameless metallized dielectric vent panel with the resiliently compressible electrically-conductive edge comprises positioning a resiliently compressible EMI gasket about the perimeter of the frameless metallized dielectric vent panel such that the resiliently compressible EMI gasket substantially covers the thickness defined between the first side and said second side.*

*57. The method of claim 49, wherein providing the frameless metallized dielectric vent panel with the resiliently compressible electrically-conductive edge comprises positioning electrically-conductive elastomer about the perimeter of the frameless metallized dielectric vent panel such that the elec-*

*trically-conductive elastomer substantially covers the thickness defined between the first side and said second side.*

*58. The method of claim 49, wherein providing the frameless metallized dielectric vent panel with the resiliently compressible electrically-conductive edge comprises providing edge treatment to the frameless metallized dielectric vent panel to create electrically-conductive protrusions extending outwardly substantially about the perimeter of the metallized dielectric vent panel.*

*59. The method of claim 58, wherein the electrically-conductive protrusions comprise at least one or more of a resilient spring finger, a dimple, or a combination thereof.*

*60. The method of claim 49, wherein providing the frameless metallized dielectric vent panel with the resiliently compressible electrically-conductive edge comprises positioning an electrically-conductive wire mesh about the perimeter of the frameless metallized dielectric vent panel such that the electrically-conductive wire mesh substantially covers the thickness defined between the first side and said second side.*

*61. The method of claim 49, further comprising providing the frameless metallized dielectric vent panel with flame retardant sufficient for achieving a flame rating of V0 under Underwriter's Laboratories (UL) Standard No. 94.*

*62. The method of claim 49, further comprising providing the frameless metallized dielectric vent panel with a corrosion inhibitor.*

*63. The method of claim 49, further comprising applying at least one coating to the frameless vent panel for enhancing at least one performance attribute of the frameless vent panel.*

*64. The method of claim 63, wherein the coating comprises at least one or more of a mildew inhibitor, a corrosion inhibitor, and a flame retardant.*

* * * * *